United States Patent
Inokuchi et al.

(10) Patent No.: US 11,646,368 B2
(45) Date of Patent: May 9, 2023

(54) SEMICONDUCTOR DEVICE

(71) Applicant: KABUSHIKI KAISHA TOSHIBA, Tokyo (JP)

(72) Inventors: Tomoaki Inokuchi, Yokohama (JP); Hiro Gangi, Ota (JP); Yusuke Kobayashi, Nagareyama (JP); Ryosuke Iijima, Setagaya (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 73 days.

(21) Appl. No.: 17/188,974

(22) Filed: Mar. 1, 2021

(65) Prior Publication Data

US 2022/0029012 A1   Jan. 27, 2022

(30) Foreign Application Priority Data

Jul. 22, 2020   (JP) .............................. JP2020-125264
Feb. 25, 2021   (JP) .............................. JP2021-028206

(51) Int. Cl.
  *H01L 29/78*   (2006.01)
  *H01L 29/10*   (2006.01)
  (Continued)

(52) U.S. Cl.
  CPC ...... *H01L 29/7806* (2013.01); *H01L 29/0696* (2013.01); *H01L 29/1079* (2013.01);
  (Continued)

(58) Field of Classification Search
  CPC . H01L 29/7806; H01L 29/404; H01L 29/407; H01L 29/66734; H01L 29/7813;
  (Continued)

(56) References Cited

U.S. PATENT DOCUMENTS 7,345,342 B2   3/2008   Challa et al.
9,525,059 B1 *  12/2016   Kobayashi .......... H01L 29/7813
(Continued)

FOREIGN PATENT DOCUMENTS

JP   2007-529115 A   10/2007
JP   2015-8184 A   1/2015
JP   2017-55016 A   3/2017

OTHER PUBLICATIONS

Hitoshi Yamaguchi, et al., "Breakthrough of on-resistance Si limit by Super 3D MOSFET under 100V breakdown voltage", Proceedings of the 18$^{th}$ International Symposium on Power Semiconductor Devices & IC's, Jun. 4-8, 2006, 4 pages.

*Primary Examiner* — Joseph C. Nicely
(74) *Attorney, Agent, or Firm* — Oblon, McClelland, Maier & Neustadt, L.L.P.

(57) ABSTRACT

According to one embodiment, a semiconductor device includes a supporter including a first surface, first, second, and third conductive parts, a semiconductor region, and an insulating part. A first direction from the first toward second conductive part is along the first surface. The semiconductor region includes first, second, and third partial regions. A second direction from the first toward second partial region is along the first surface and crosses the first direction. The third partial region is between the first partial region and the second conductive part in the first direction. The third partial region includes a counter surface facing the second conductive part. A direction from the counter surface toward the third conductive part is along the second direction. The insulating part includes an insulating region. At least a portion of the insulating region is between the counter surface and the third conductive part.

20 Claims, 28 Drawing Sheets

(51) Int. Cl.
  *H01L 29/66* (2006.01)
  *H01L 29/40* (2006.01)
  *H01L 29/06* (2006.01)
(52) U.S. Cl.
  CPC ........ *H01L 29/1095* (2013.01); *H01L 29/404* (2013.01); *H01L 29/407* (2013.01); *H01L 29/66734* (2013.01); *H01L 29/7812* (2013.01); *H01L 29/7813* (2013.01)
(58) Field of Classification Search
  CPC ............ H01L 29/0696; H01L 29/1079; H01L 29/1095; H01L 29/7812
  See application file for complete search history.

(56) References Cited

U.S. PATENT DOCUMENTS

| | | | |
|---|---|---|---|
| 2014/0252463 A1* | 9/2014 | Darwish | H01L 29/7806 257/330 |
| 2015/0069504 A1* | 3/2015 | Nozu | H01L 29/7827 257/331 |
| 2016/0268420 A1* | 9/2016 | Arai | H01L 29/407 |
| 2020/0212219 A1* | 7/2020 | Kim | H01L 29/4236 |
| 2021/0305369 A1* | 9/2021 | Nakano | H01L 29/1608 |

* cited by examiner

SEMICONDUCTOR DEVICE

CROSS-REFERENCE TO RELATED APPLICATIONS

This application is based upon and claims the benefit of priority from Japanese Patent Application No. 2020-125264, filed on Jul. 22, 2020, and Japanese Patent Application No. 2021-028206, filed on Feb. 25, 2021; the entire contents of which are incorporated herein by reference.

FIELD

Embodiments described herein generally relate to a semiconductor device.

BACKGROUND

It is desirable to improve the characteristics of a semiconductor device.

DETAILED DESCRIPTION

Figure 1:
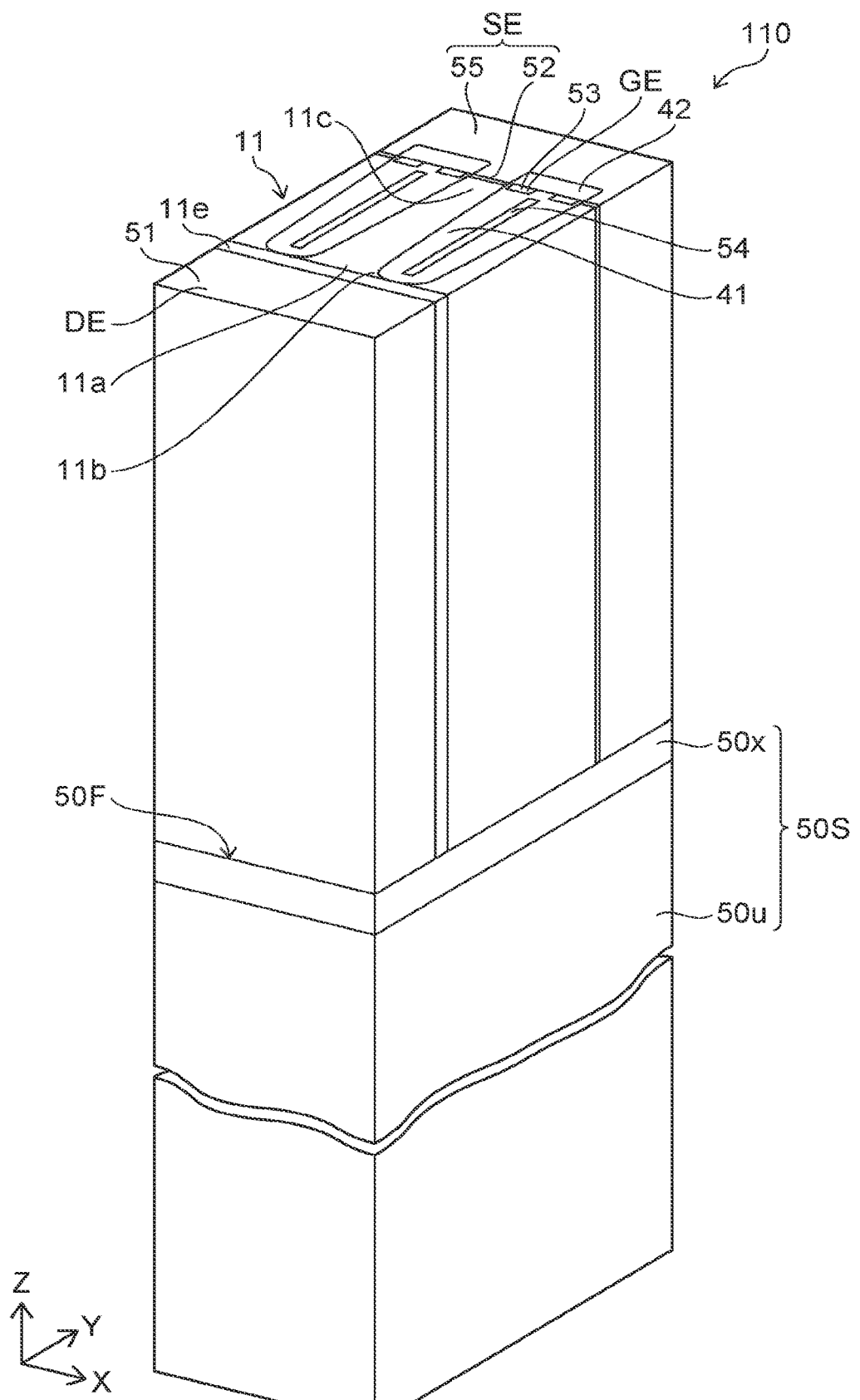
FIG. 1 is a schematic view illustrating a semiconductor device according to a first embodiment.

According to one embodiment, a semiconductor device includes a supporter including a first surface, a first conductive part, a second conductive part, a third conductive part, a first semiconductor region of a first conductivity type, and a first insulating part. A first direction from the first conductive part toward the second conductive part is along the first surface. The first semiconductor region includes a first partial region, a second partial region, and a third partial region. A second direction from the first partial region toward the second partial region is along the first surface and crosses the first direction. The third partial region is between the first partial region and the second conductive part in the first direction. The third partial region includes a counter surface facing the second conductive part. The third partial region and the second conductive part have a Schottky contact. A direction from the counter surface toward the third conductive part is along the second direction. The first insulating part includes a first insulating region. At least a portion of the first insulating region is between the counter surface and the third conductive part.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described or illustrated previously in an antecedent drawing are marked with like reference numerals, and a detailed description is omitted as appropriate.

First Embodiment

Figure 2:
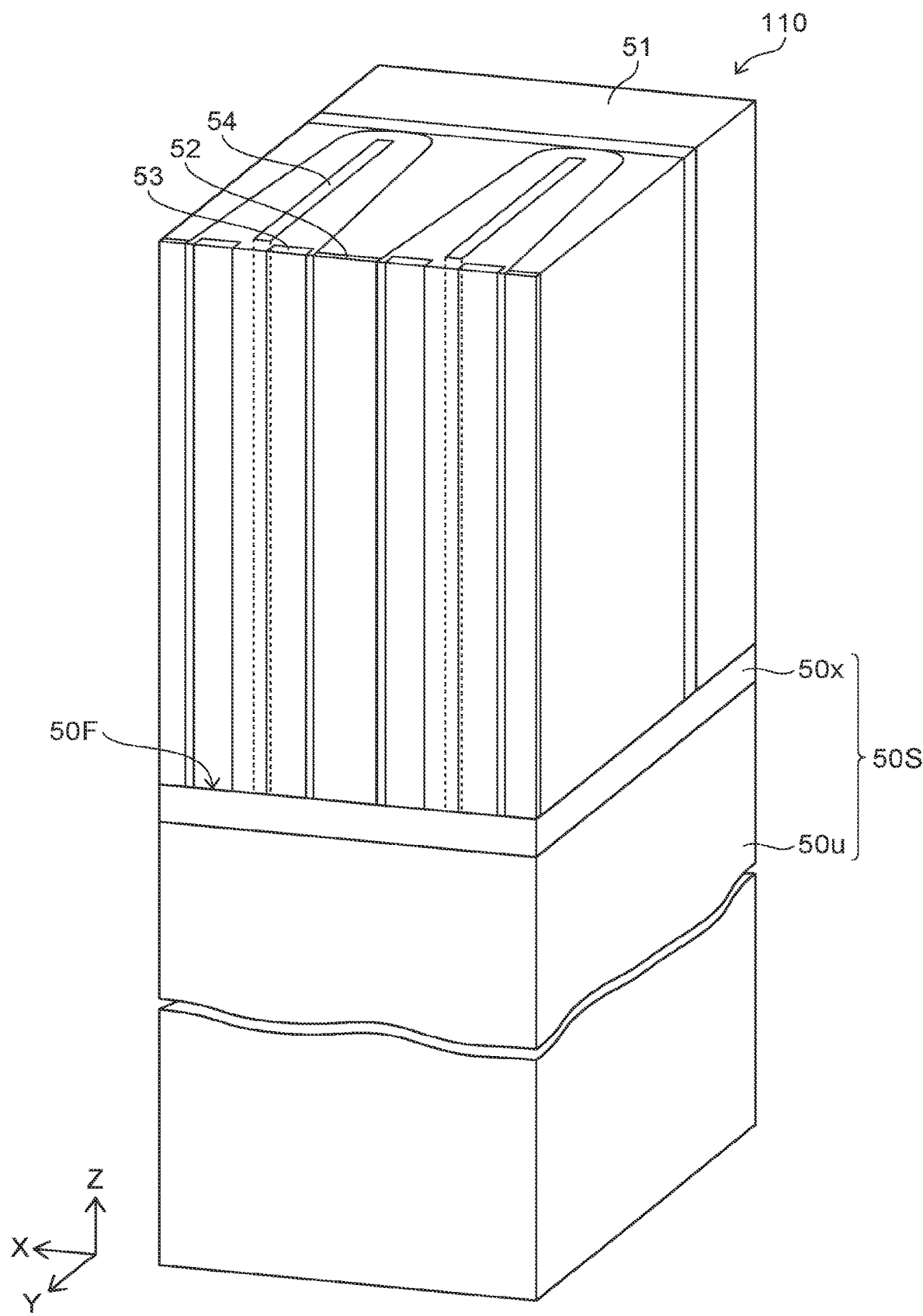
FIG. 2 is a schematic view illustrating the semiconductor device according to the first embodiment.
Figure 3:
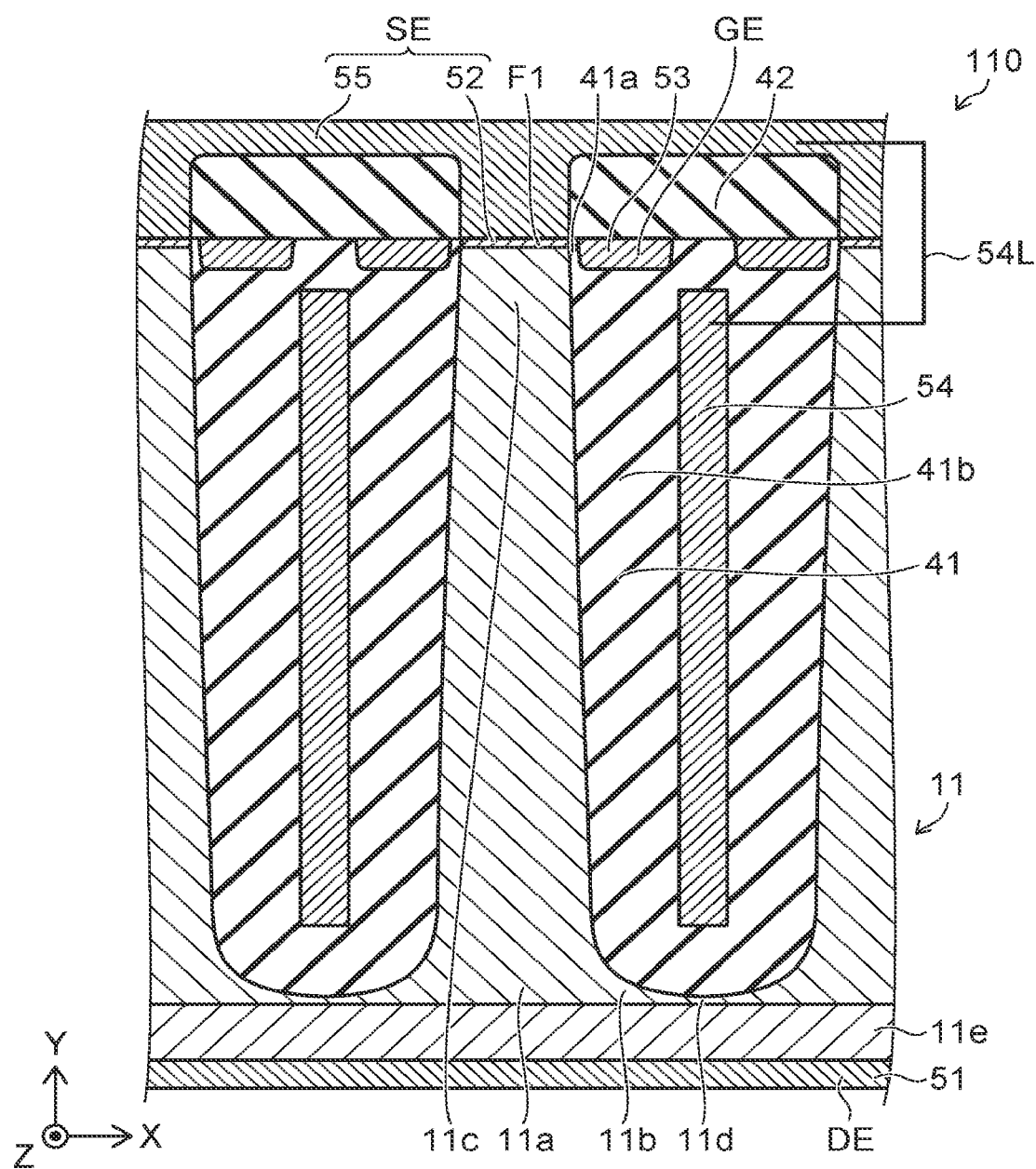
FIG. 3 is a schematic view illustrating the semiconductor device according to the first embodiment.

FIGS. 1 to 3 are schematic views illustrating a semiconductor device according to a first embodiment.

FIG. 1 is a perspective view. FIG. 2 is a perspective view in which some of the components included in the semiconductor device are removed. FIG. 3 is a cross-sectional view.

As shown in FIGS. 1 to 3, the semiconductor device 110 according to the embodiment includes a supporter 505, a first conductive part 51, a second conductive part 52, a third conductive part 53, a first semiconductor region 11, and a first insulating part 41.

The supporter 50S may be, for example, a substrate. In the example as shown in FIG. 1, the supporter 50S includes a substrate part 50u and an insulating layer 50x. The substrate part 50u is, for example, a silicon substrate. The insulating layer 50x is located on the substrate part 50u. The insulating layer 50x is, for example, a silicon oxide layer (e.g., a thermal oxide film).

The supporter 50S includes a first surface 50F. The first surface 50F is, for example, an upper surface. In the example, the first surface 50F corresponds to the upper surface of the insulating layer 50x.

One direction parallel to the first surface 50F is taken as an X-axis direction. A direction parallel to the first surface 50F and perpendicular to the X-axis direction is taken as a Y-axis direction. A direction perpendicular to the X-axis direction and the Y-axis direction is taken as a Z-axis direction. The first surface 50F is perpendicular to the Z-axis direction.

The first conductive part 51, the second conductive part 52, the third conductive part 53, the first semiconductor region 11, the first insulating part 41, etc., are located on the first surface 50F. As described below, the semiconductor device 110 may include a fourth conductive part 54, a fifth conductive part 55, and a second insulating part 42.

The direction (e.g., the first direction) from the first conductive part 51 toward the second conductive part 52 is along the first surface 50F. The first direction is, for example, the Y-axis direction.

The first semiconductor region 11 is of a first conductivity type. The first conductivity type is one of an n-type or a p-type. Hereinbelow, the first conductivity type is taken to be the n-type.

As shown in FIGS. 1 and 3, the first semiconductor region 11 includes a first partial region 11a, a second partial region 11b, and a third partial region 11c. A second direction from the first partial region 11a toward the second partial region 11b is along the first surface 50F and crosses the first direction. The second direction is, for example, the X-axis direction.

As shown in FIG. 3, the third partial region 11c is between the first partial region 11a and the second conductive part 52 in the first direction (the Y-axis direction). The third partial region 11c includes a counter surface F1 that faces the second conductive part 52. The third partial region 11c and the second conductive part 52 have a Schottky contact.

In the example as shown in FIG. 3, the direction from the counter surface F1 toward the third conductive part 53 is along the second direction (e.g., the X-axis direction).

The first insulating part 41 includes a first insulating region 41a. For example, at least a portion of the first insulating region 41a is between the third conductive part 53 and at least a portion of the second conductive part 52. At least a portion of the first insulating region 41a is between the counter surface F1 and the third conductive part 53. For example, the first insulating part 41 (e.g., the first insulating region 41a) electrically insulates the second conductive part 52 and the third conductive part 53. For example, the first insulating part 41 (e.g., the first insulating region 41a) electrically insulates the third partial region 11c and the third conductive part 53.

For example, the direction from a portion of the third partial region 11c toward the third conductive part 53 may be along the second direction (e.g., the X-axis direction).

The direction from at least a portion of the second conductive part 52 toward the third conductive part 53 may be along the second direction.

As shown in FIGS. 1 and 3, the second conductive part 52, the first semiconductor region 11, and the first insulating part 41 are located between the first conductive part 51 and the fifth conductive part 55 in the Y-axis direction. The fifth conductive part 55 is electrically connected to the second conductive part 52.

For example, the current that flows between the first conductive part 51 and the second conductive part 52 is controlled by controlling the potential of the third conductive part 53. For example, the first conductive part 51 functions as a drain electrode DE. The second conductive part 52 and the fifth conductive part 55 function as a source electrode SE. For example, the third conductive part 53 functions as a gate electrode GE. For example, the first insulating region 41a functions as a gate insulating film. The semiconductor device 110 is, for example, a transistor.

In the semiconductor device 110, a Schottky barrier is formed at the interface between the third partial region 11c and the second conductive part 52. The thickness (e.g., the distance in the Y-axis direction) of the Schottky barrier can be controlled by the potential of the third conductive part 53. A current substantially does not flow when the Schottky barrier is thick. The off-state is obtained thereby. By controlling the potential of the third conductive part 53, the thickness of the Schottky barrier is reduced, and, for example, a tunnel current is caused to flow. The on-state is obtained by the flow of the tunnel current. According to the embodiment, a semiconductor device can be provided in which the characteristics can be improved.

For example, there is a transistor of a reference example that has a p-n-p structure. In such a case, a body diode that occurs at the contact portion of the source electrode includes a p-n junction. Therefore, a long period of time is necessary for recovery.

Conversely, in the embodiment, the region that includes the third partial region 11c and the second conductive part 52 (the region that includes the Schottky contact) is the body diode. In the embodiment, the recovery can be faster because the body diode is a Schottky diode.

In a reference example that uses a p-n-p structure, a gate electrode and a region including a first $n^-$-region, a $p^-$-region, and a second $n^-$-region face each other. Therefore, the gate length is long.

Conversely, in the embodiment, it is sufficient for the third conductive part 53 to face the interface (e.g., the counter surface F1) between the third partial region 11c and the second conductive part 52. Therefore, the gate length is short. The total gate charge amount (Qg) is reduced thereby. The gate capacitance is small. High-speed switching is obtained thereby. The loss is small. For example, the gate capacitance (Cg) and the gate-drain capacitance (Cgd) are reduced. The total gate charge amount (Qg) and the gate-drain charge amount (Qgd) are reduced thereby. The loss of the gate driver can be reduced thereby. For example, the switching can be faster. For example, the turn-on loss and the turn-off loss can be suppressed.

FIG. 2 illustrates a state in which the fifth conductive part 55 and the second insulating part 42 are removed. In the example as shown in FIG. 2, the second conductive part 52 (a portion of the source electrode SE) and the third conductive part 53 (the gate electrode GE) extend along the Z-axis direction.

In the embodiment, the gate electrode GE extends along the Z-axis direction perpendicular to the first surface 50F on the first surface 50F of the supporter 50S (e.g., the substrate). By such a configuration, transistors can be provided with high density on the supporter 50S (e.g., the substrate). The channel surface area per unit area can be increased. For example, the on-resistance can be reduced thereby. Switching of a large current is possible.

As shown in FIG. 3, the third conductive part 53 may face a portion of the third partial region 11c and a portion of the second conductive part 52 in addition to the counter surface F1. For example, the thickness (the length along the first direction, i.e., the Y-axis direction) of the third conductive part 53 may be thin. The thickness of the third conductive part 53 may be, for example, not more than 100 nm.

In a reference example that uses a p-n-p structure, it is difficult to reduce the width (the length in the X-axis direction) of the source contact portion when considering misalignment. Therefore, it is difficult to reduce the pitch of the multiple source contacts.

Conversely, in the embodiment, a trench contact is unnecessary. It is sufficient for the second conductive part 52 to contact the third partial region 11c. In the embodiment, it is easier to reduce the pitch of the multiple source contacts. For example, a small and low-resistance semiconductor device can be provided.

There is a parasitic bipolar structure in a reference example that uses a p-n-p structure. For example, avalanche breakdown easily occurs when an excessively large hole current is injected from the drain side.

Conversely, there is no parasitic bipolar structure in the embodiment. Therefore, for example, a high avalanche breakdown voltage is obtained.

Thus, according to the embodiment, a semiconductor device can be provided in which the characteristics can be improved.

In the embodiment, the first conductive part 51, the second conductive part 52, the third conductive part 53, the first semiconductor region 11, the first insulating part 41, etc., are located on the first surface 50F of the supporter 50S. As shown in FIG. 2, the first conductive part 51 and the second conductive part 52 extend along the third direction (the Z-axis direction) perpendicular to the first surface 50F. By such a configuration, the density of the element parts at the first surface 50F of the supporter 50S (e.g., the substrate) can be increased. For example, the on-resistance per unit area can be reduced thereby. A semiconductor device can be provided in which the characteristics can be improved.

As shown in FIG. 3, the first semiconductor region 11 may include a fourth partial region 11d and a fifth partial region 11e. The second partial region 11b is between the first partial region 11a and the fourth partial region 11d in the second direction (the X-axis direction).

The fifth partial region 11e is located between the first conductive part 51 and the first partial region 11a. In the example, the fifth partial region 11e is located also between the first conductive part 51 and the second partial region 11b and between the first conductive part 51 and the fourth partial region 11d. The impurity concentration of the first conductivity type in the fifth partial region 11e is greater than the impurity concentration of the first conductivity type in the first partial region 11a. The fifth partial region 11e is, for example, an $n^+$-region. The first to fourth partial regions 11a to 11d are, for example, $n^-$-regions. By providing the fifth partial region 11e, a good electrical connection is obtained between the first semiconductor region 11 and the first conductive part 51.

As shown in FIG. 3, the semiconductor device 110 may include the fourth conductive part 54. The direction from the fourth partial region 11d toward the fourth conductive part 54 is along the first direction (the Y-axis direction). The direction from at least a portion of the third partial region 11c toward the fourth conductive part 54 is along the second direction (e.g., the X-axis direction). The first insulating part 41 includes a second insulating region 41b. The second insulating region 41b is between the fourth conductive part 54 and at least a portion of the third partial region 11c in the second direction (e.g., the X-axis direction). For example, the second insulating region 41b electrically insulates the third partial region 11c and the fourth conductive part 54.

For example, the fourth conductive part 54 is electrically connected to the second conductive part 52. Or, the fourth conductive part 54 may be capable of being electrically connected to the second conductive part 52. In the example, the fourth conductive part 54 is electrically connected to the second conductive part 52 via the fifth conductive part 55 by an interconnect 54L. A terminal may be provided in the interconnect 54L; and the terminal and the second conductive part 52 may be electrically connected outside the semiconductor device 110.

The potential of the fourth conductive part 54 is set to the potential of the second conductive part 52 (e.g., a source potential). By providing the fourth conductive part 54, the electric field in the first semiconductor region 11 can be controlled. For example, local concentration of the electric field can be suppressed. For example, high reliability is easily obtained. For example, the fourth conductive part 54 functions as a field plate.

As shown in FIG. 3, the second conductive part 52 is between the third partial region 11c and at least a portion of the fifth conductive part 55 in the first direction (the Y-axis direction). The fifth conductive part 55 is electrically connected to the second and fourth conductive parts 52 and 54.

As shown in FIG. 3, the semiconductor device 110 may include the second insulating part 42. The third conductive part 53 is between the second partial region 11b and the fifth conductive part 55 in the first direction (the Y-axis direction). At least a portion of the second insulating part 42 is between the third conductive part 53 and at least a portion of the fifth conductive part 55 in the first direction (the Y-axis direction). In the example, the third conductive part 53 is between the second insulating region 41b and at least a portion of the second insulating part 42 in the first direction.

In the embodiment, the first semiconductor region 11 may include, for example, at least one selected from the group consisting of silicon (Si), a nitride semiconductor (e.g., GaN, etc.), silicon carbide (SiC), and an oxide semiconductor (e.g., GaO). When the first semiconductor region 11 includes silicon, the first-conductivity-type impurity includes, for example, at least one selected from the group consisting of phosphorus, arsenic, and antimony.

In one example, when the third partial region 11c of the first semiconductor region 11 includes silicon, the second conductive part 52 includes at least one selected from the group consisting of Ti, W, Mo, Ta, Zr, Al, Sn, V, Re, Os, Ir, Pt, Pd, Rh, Ru, Nb, Sr, and Hf.

The third conductive part 53 and the fourth conductive part 54 may include, for example, at least one of polysilicon or a metal. The fifth conductive part 55 includes, for example, at least one selected from the group consisting of Al, Cu, Mo, W, Ta, Co, Ru, Ti, and Pt. The first conductive part 51 includes, for example, Al, Cu, Mo, W, Ta, Co, Ru, Ti, Pt, etc.

Figure 4:
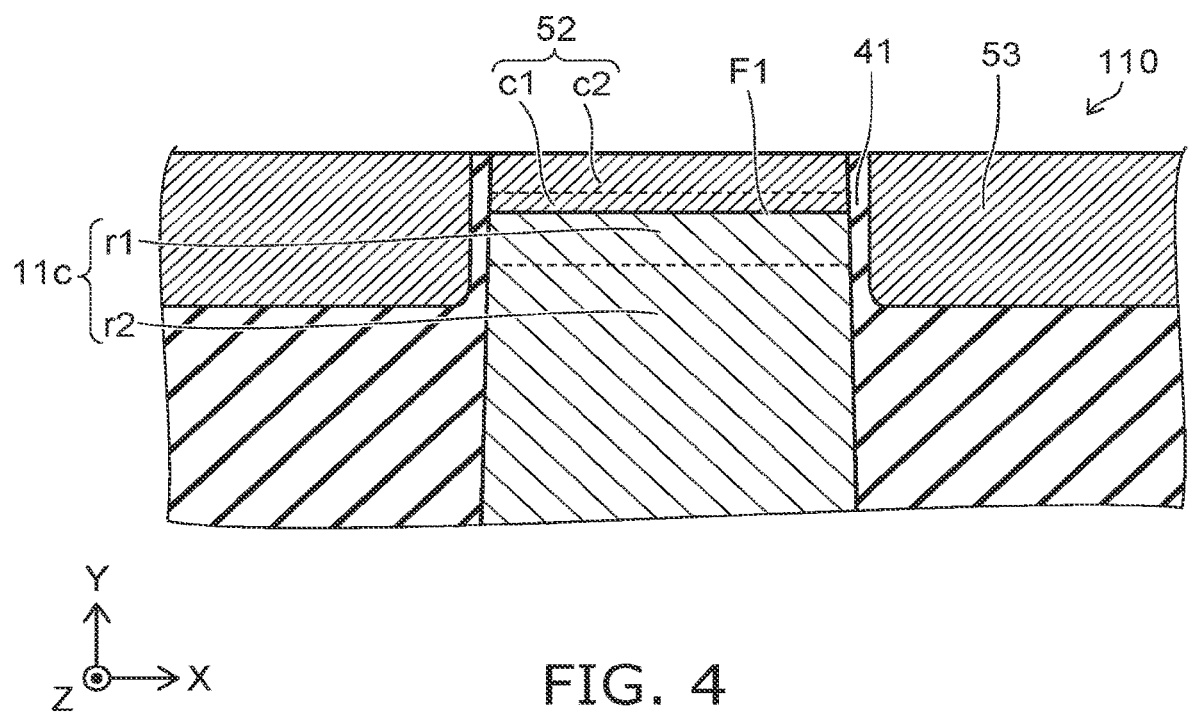
FIG. 4 is a schematic cross-sectional view illustrating a portion of the semiconductor device according to the first embodiment.

FIG. 4 is a schematic cross-sectional view illustrating a portion of the semiconductor device according to the first embodiment.

FIG. 4 is an enlarged view of a region including the second conductive part 52.

As shown in FIG. 4, the third partial region 11c may include a first region r1 and a second region r2. The first region r1 is between the second region r2 and the second conductive part 52 in the first direction (the Y-axis direction). The concentration of the first-conductivity-type impurity in the first region r1 is greater than the concentration of the first-conductivity-type impurity in the second region r2. The first region r1 is, for example, an $n^+$-region. The second region r2 is, for example, an $n^-$-region. The first region r1 is thin. In one example, the thickness along the first direction of the first region r1 is not less than 1 nm and not more than 20 nm.

By providing the first region r1, for example, the thickness (the length along the Y-axis direction) of the Schottky barrier in the on-state can be thin. The on-current can be increased thereby.

As shown in FIG. 4, the second conductive part 52 may include a first conductive region c1 and a second conductive region c2. The first conductive region c1 is between the third partial region 11c and the second conductive region c2 in the first direction (the Y-axis direction).

For example, the second conductive region c2 includes a first element. The third partial region 11c includes a second element. The first conductive region c1 includes a compound including the first and second elements. For example, the second conductive region c2 includes a first metallic element. The third partial region 11c includes silicon. The first conductive region c1 includes a silicide including the first metallic element. The first metallic element is, for example, at least one selected from the group consisting of Ti, W, Mo, Ta, Zr, Al, Sn, V, Re, Os, Ir, Pt, Pd, Rh, Ru, Nb, Sr, and Hf.

By providing the first conductive region c1 and the second conductive region c2 such as those described above, the first region r1 that includes the first-conductivity-type impurity with a high concentration is easily formed.

In one example, a metal layer that is used to form the second conductive part 52 is formed in contact with a silicon layer that is used to form the third partial region 11c. The metal layer includes a first-conductivity-type impurity. For example, a silicide region is formed in the portion of the metal layer at the silicon layer side by heat treatment, etc. At this time, an impurity that is included in the silicon layer before forming the silicide region moves downward from the silicide region (toward the first conductive part 51). Thereby, a region (e.g., the first region r1) that includes the impurity with a high concentration is formed in the portion of the third partial region 11c facing the silicide region.

In one example, a metal layer that is used to form the second conductive part 52 may be formed in contact with a silicon layer that is used to form the third partial region 11c; and a first-conductivity-type impurity may be introduced to a portion of the silicon layer via the metal layer. A region (e.g., the first region r1) that includes the impurity with a high concentration is formed in the portion of the silicon layer facing the metal layer. For example, the concentration of the first-conductivity-type impurity in at least a portion of the second conductive region c2 may be greater than the concentration of the impurity in at least a portion of the first conductive region c1.

Figure 5:
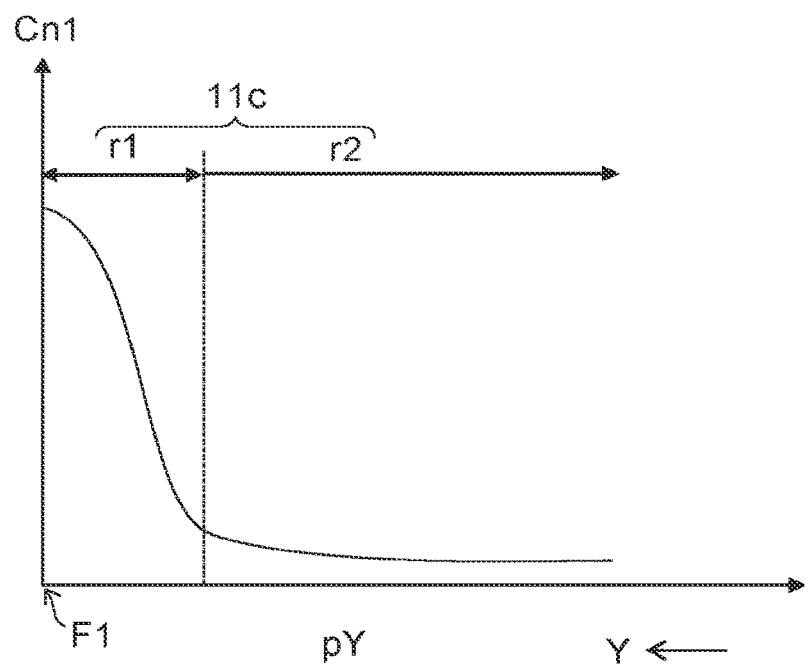
FIG. 5 is a schematic view illustrating a portion of the semiconductor device according to the first embodiment.

FIG. 5 is a schematic view illustrating a portion of the semiconductor device according to the first embodiment.

FIG. 5 illustrates the impurity profile in a region including the third partial region 11c. The horizontal axis of FIG. 5 is a position pY in the Y-axis direction. The vertical axis is a concentration Cn1 of the first-conductivity-type impurity.

As shown in FIG. 5, the concentration Cn1 of the impurity in the first region r1 is greater than the concentration Cn1 of the impurity in the second region r2.

An example of a method for manufacturing the semiconductor device 110 according to the embodiment will now be described.

Figure 6:
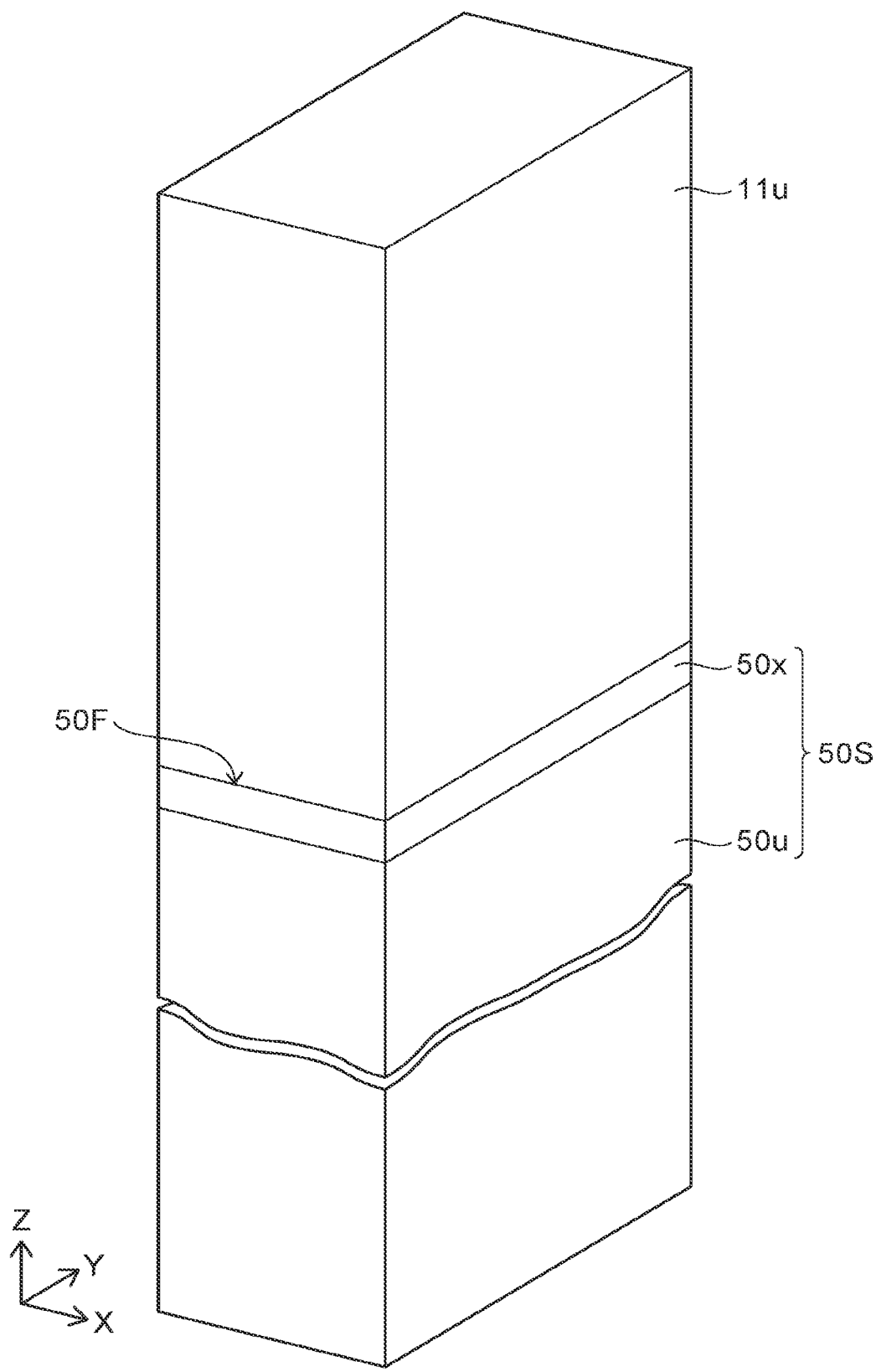
FIG. 6 is a schematic perspective view illustrating a method for manufacturing the semiconductor device according to the first embodiment.

FIG. 6 is a schematic perspective view illustrating the method for manufacturing the semiconductor device according to the first embodiment.

FIGS. 7A to 7D are schematic cross-sectional views illustrating the method for manufacturing the semiconductor device according to the first embodiment.

The supporter 50S and a semiconductor layer 11u are prepared as shown in FIG. 6. The semiconductor layer 11u is provided on the first surface 50F of the supporter 50S. The semiconductor layer 11u is used to form the first semiconductor region 11.

Figure 7A:
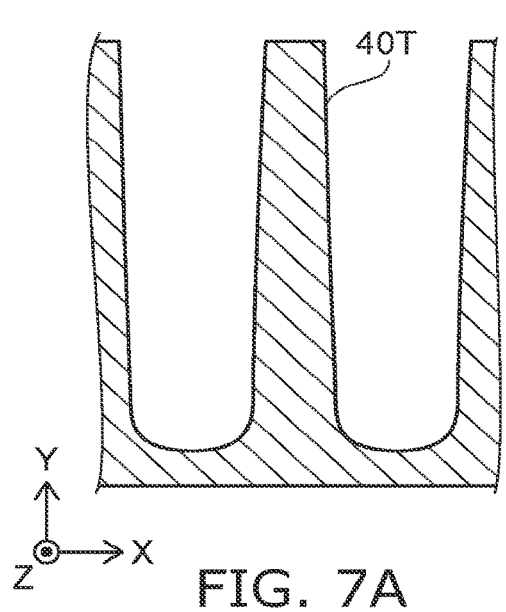
FIGS. 7A to 7D are schematic cross-sectional views illustrating the method for manufacturing the semiconductor device according to the first embodiment.

As shown in FIG. 7A, a trench 40T is formed by removing a portion of the semiconductor layer 11u by photolithography and RIE (Reactive Ion Etching). The trench 40T extends in the Z-axis direction.

Subsequently, an insulating film (e.g., silicon oxide) is formed inside the trench 40T; and a conductive material (e.g., polysilicon) is filled into the remaining region by CVD (Chemical Vapor Deposition), etc.

Figure 7B:
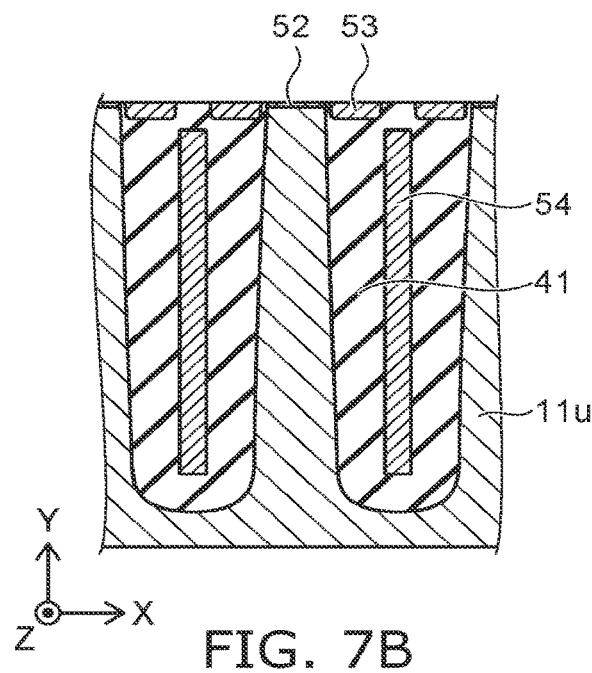

As shown in FIG. 7B, the first insulating part 41 is obtained from the insulating film described above. The third conductive part 53 and the fourth conductive part 54 are obtained from the conductive material described above.

As shown in FIG. 7B, the second conductive part 52 is obtained from a metal film (e.g., a Ti film) or the like by forming the metal film in contact with a portion of the semiconductor layer 11u.

Figure 7C:
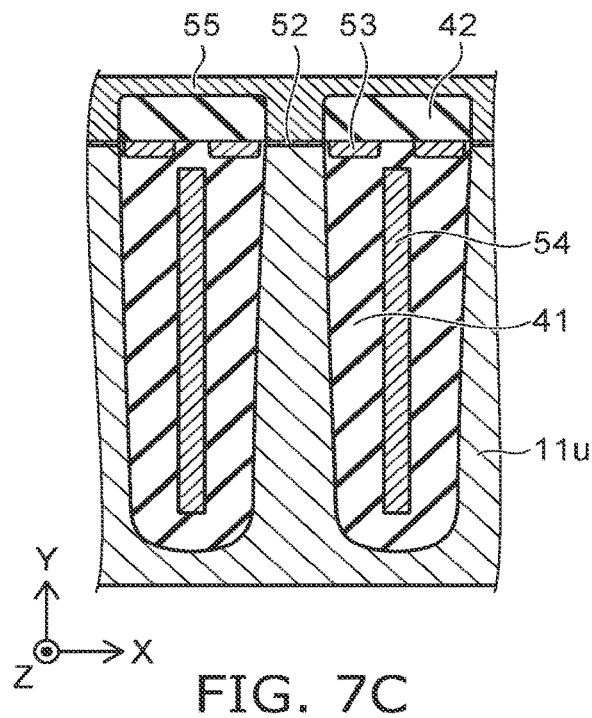

As shown in FIG. 7C, the second insulating part 42 is formed, and the fifth conductive part 55 is formed.

Figure 7D:
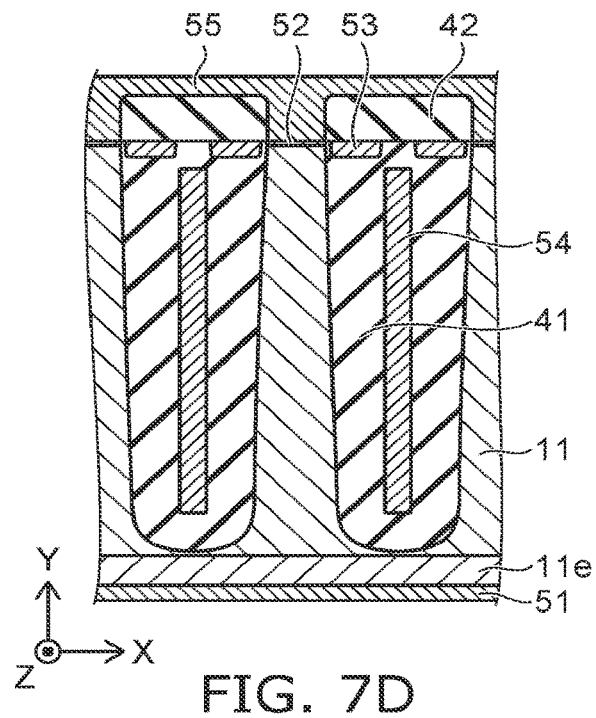

As shown in FIG. 7D, the fifth partial region 11e is formed by introducing an impurity into a portion of the semiconductor layer 11u. Subsequently, the first conductive part 51 is formed by forming a metal film on the surface of the fifth partial region 11e. Thus, the semiconductor device 110 is obtained.

Figure 8:
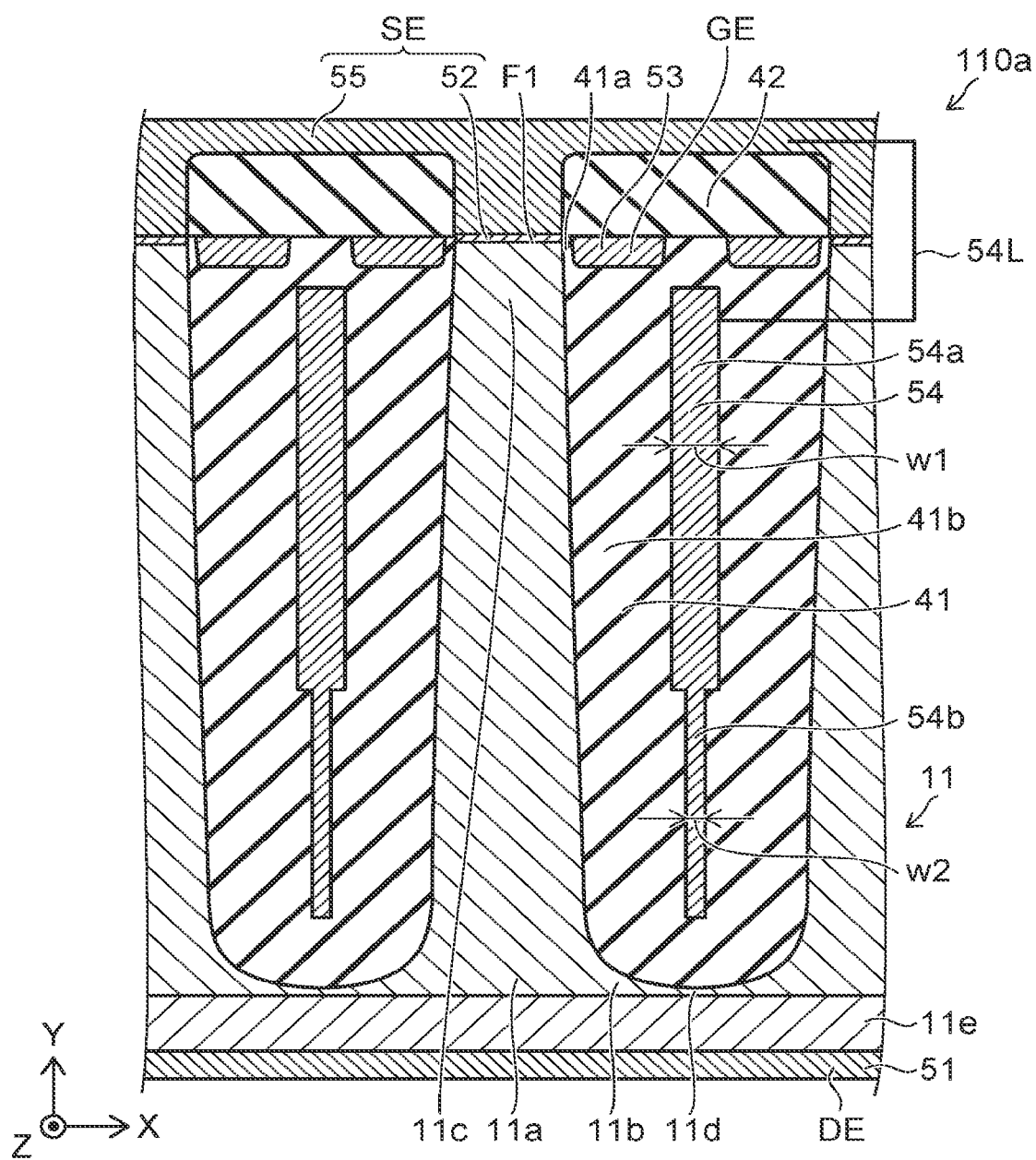
FIG. 8 is a schematic cross-sectional view illustrating a semiconductor device according to the first embodiment.

FIG. 8 is a schematic cross-sectional view illustrating a semiconductor device according to the first embodiment.

In the semiconductor device 110a according to the embodiment as shown in FIG. 8, the length (the width) along the X-axis direction of the fourth conductive part 54 changes. Otherwise, the configuration of the semiconductor device 110a is similar to the configuration of the semiconductor device 110. An example of the fourth conductive part 54 of the semiconductor device 110a will now be described.

As shown in FIG. 8, the fourth conductive part 54 includes a first conductive partial region 54a and a second conductive partial region 54b. The second conductive partial region 54b is between the first conductive part 51 and the first conductive partial region 54a in the first direction (the Y-axis direction). A length w2 (a width) along the second direction (the X-axis direction) of the second conductive partial region 54b is less than a length w1 (a width) along the second direction (the X-axis direction) of the first conductive partial region 54a. By such a configuration, for example, the electric field at the vicinity of the second partial region 11b of the first semiconductor region 11 can be further relaxed.

An example of a method for manufacturing the semiconductor device 110a will now be described.

Figures 9A, 9B:
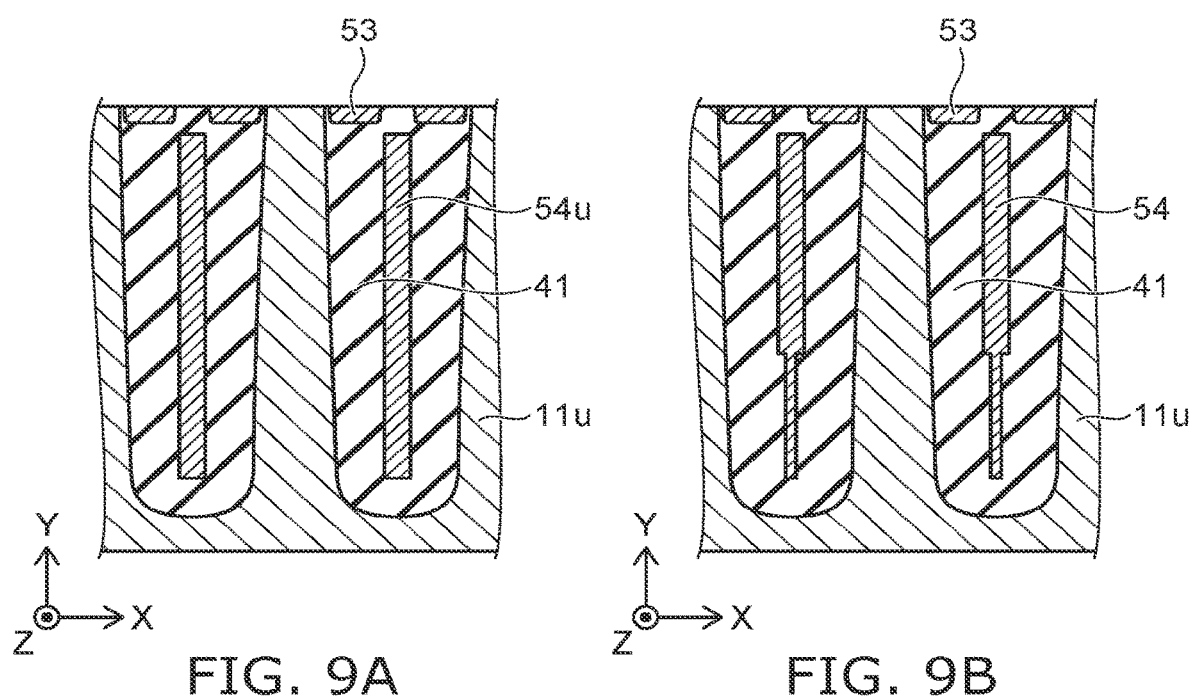
FIGS. 9A and 9B are schematic cross-sectional views illustrating a method for manufacturing the semiconductor device according to the first embodiment.

FIGS. 9A and 9B are schematic cross-sectional views illustrating the method for manufacturing the semiconductor device according to the first embodiment.

As shown in FIG. 9A, the third conductive part 53 and a conductive part 54u (e.g., polysilicon) are formed in a portion of the semiconductor layer 11u by the method described with reference to FIGS. 7A and 7B.

Subsequently, a portion of the conductive part 54u is removed by photolithography and RIE. Subsequently, the surface of the conductive part 54u is oxidized. The oxidized conductive part 54u expands and becomes a continuous body with the insulating film used to form a portion of the first insulating part 41. A portion of the first insulating part 41 is obtained from the oxidized conductive part 54u. The conductive part 54u that remains without being oxidized is used to form a portion of the fourth conductive part 54. As shown in FIG. 9B, the first insulating part 41 and the fourth conductive part 54, which has a width that changes, are obtained thereby.

Or, an insulating member may be formed by CVD or the like in a region where a portion of the conductive part 54u is removed, and the insulating member may be used to form a portion of the first insulating part 41.

Subsequently, the second conductive part 52, the fifth conductive part 55, the fifth partial region 11e, and the first conductive part 51 are formed by the method described with reference to FIGS. 7B to 7D. The semiconductor device 110a is obtained thereby.

Figure 10:
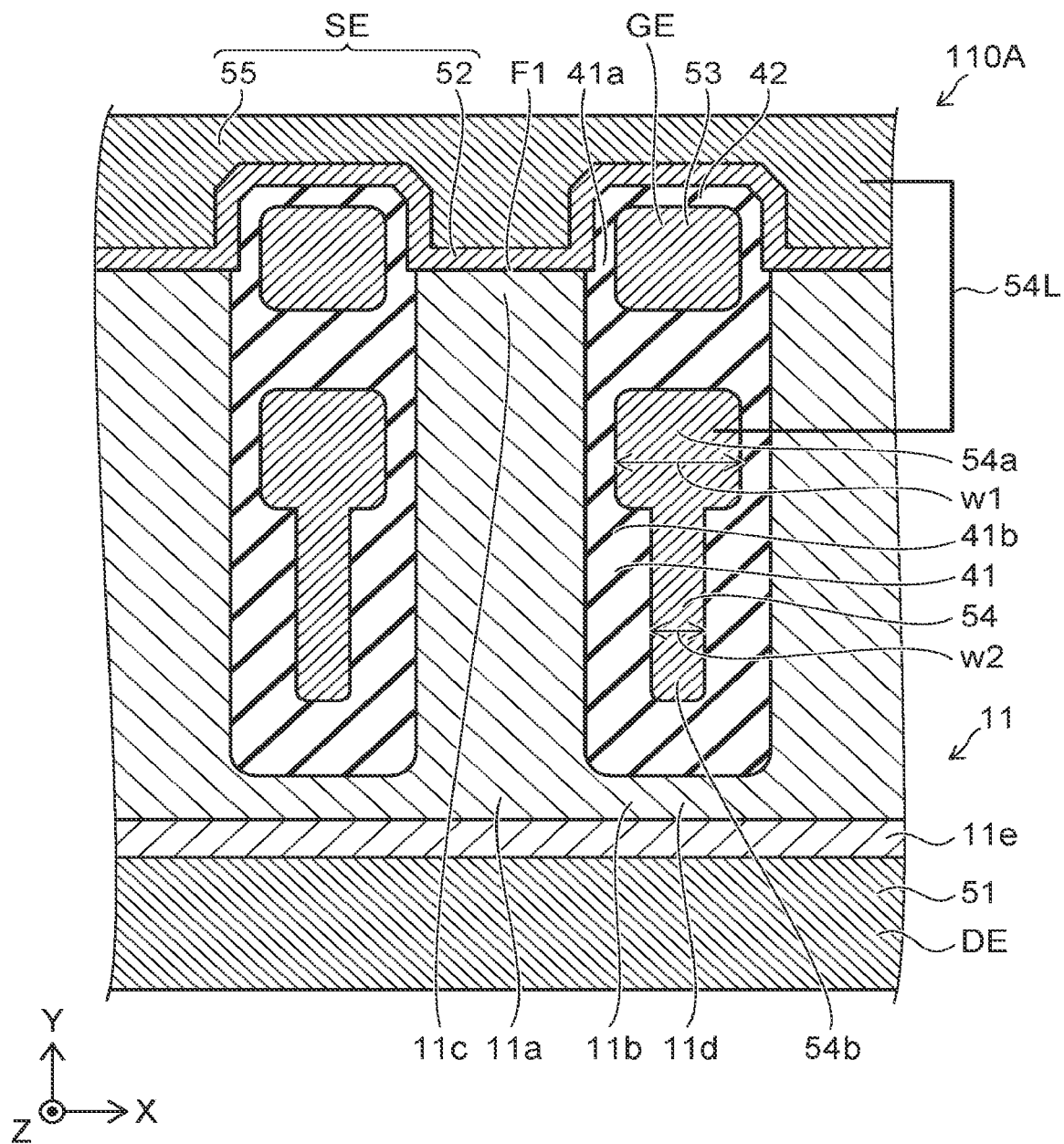
FIG. 10 is a schematic cross-sectional view illustrating a semiconductor device according to the first embodiment.

FIG. 10 is a schematic cross-sectional view illustrating a semiconductor device according to the first embodiment.

In the semiconductor device 110A according to the embodiment as shown in FIG. 10, a metal film that extends between the second insulating part 42 and the fifth conductive part 55 is used to form the second conductive part 52, which has a Schottky contact with the third partial region 11c. Otherwise, the configuration of the semiconductor device 110A is similar to the configuration of the semiconductor device 110.

An example of a method for manufacturing the semiconductor device 110A will now be described.

FIGS. 11A to 11D are schematic cross-sectional views illustrating the method for manufacturing the semiconductor device according to the first embodiment.

Figure 11A:
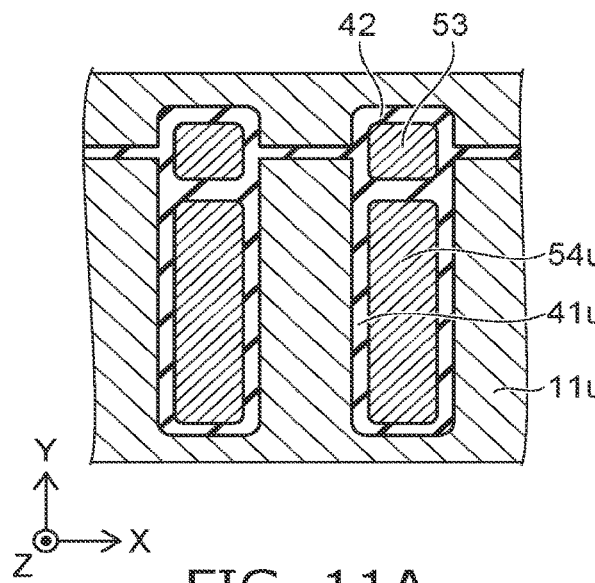
FIGS. 11A to 11D are schematic cross-sectional views illustrating a method for manufacturing the semiconductor device according to the first embodiment.

As shown in FIG. 11A, the semiconductor layer 11u is patterned by photolithography and RIE; an insulating film (e.g., silicon oxide) is formed; and a conductive material (e.g., polysilicon) is filled into the remaining region by CVD, etc. An insulating part 41u, the second insulating part 42, the third conductive part 53, and the conductive part 54u are obtained thereby.

Figure 11B:
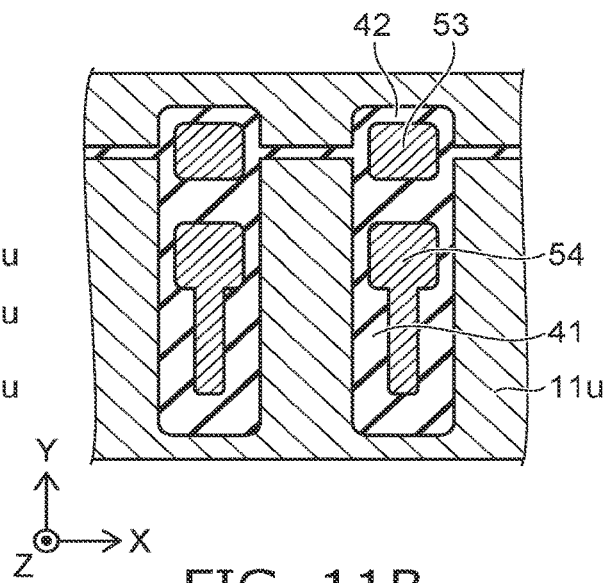
Figure 11C:
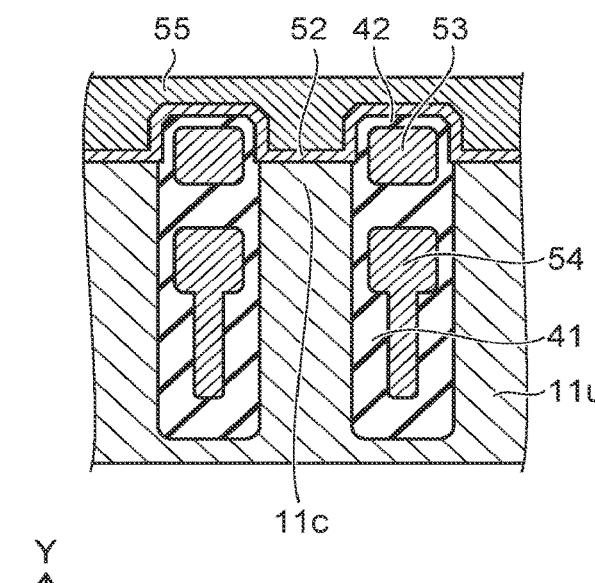

Subsequently, a portion of the conductive part 54u (e.g., polysilicon) is removed by photolithography and RIE. Subsequently, the surface of the conductive part 54u is oxidized. The oxidized conductive part 54u expands becomes a continuous body with the insulating film used to form a portion of the first insulating part 41. A portion of the first insulating part 41 is obtained from the oxidized conductive part 54u. The conductive part 54u that remains without being oxidized is used to form a portion of the fourth conductive part 54. As shown in FIG. 11B, the first insulating part 41 and the fourth conductive part 54, which has a width that changes, are obtained thereby. Or, an insulating member may be formed by CVD or the like in a region where a portion of the conductive part 54u is removed, and the insulating member may be used to form a portion of the first insulating part 41.

Subsequently, the surface of the portion of the first semiconductor region 11 that is used to form the third partial region 11c is exposed by removing a portion of the semiconductor layer 11u and a portion of the second insulating part 42. The second conductive part 52 is obtained by forming a metal film on this surface and on the surface of the second insulating part 42 (referring to FIG. 11C). The fifth conductive part 55 is obtained by forming a conductive film to cover the second conductive part 52 (referring to FIG. 11C).

Figure 11D:
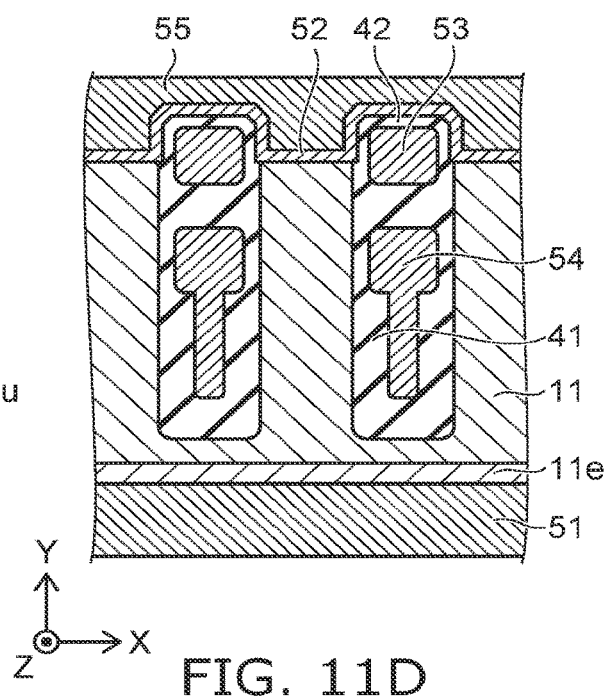

The fifth partial region 11e and the first conductive part 51 are formed as shown in FIG. 11D. Thus, the semiconductor device 110A is obtained.

FIGS. 12A to 12E are schematic cross-sectional views illustrating semiconductor devices according to the first embodiment.

Figure 12A:
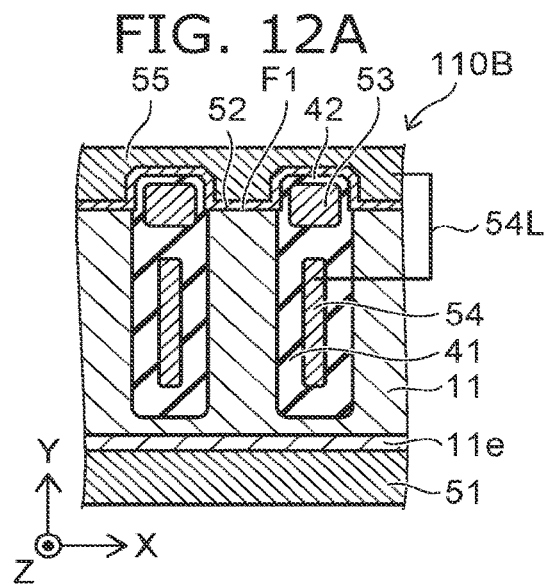
FIGS. 12A to 12E are schematic cross-sectional views illustrating semiconductor devices according to the first embodiment.

In a semiconductor device 110B as shown in FIG. 12A, the width in the X-axis direction of the fourth conductive part 54 is substantially constant.

Figure 12B:
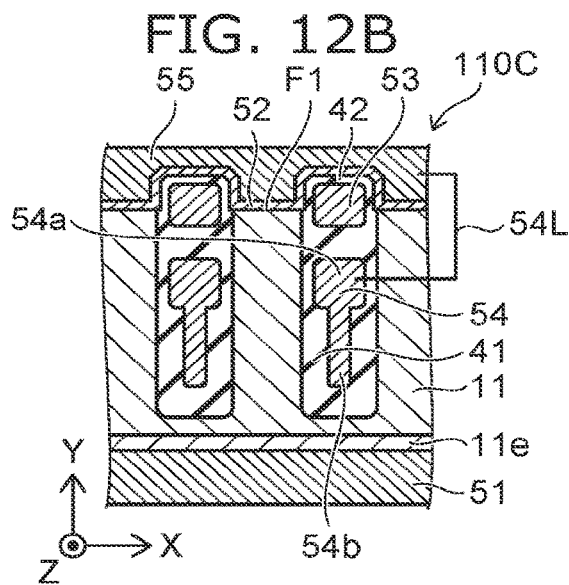

In a semiconductor device 110C as shown in FIG. 12B, the width along the X-axis direction of the second conductive partial region 54b of the fourth conductive part 54 is less than the width along the X-axis direction of the first conductive partial region 54a of the fourth conductive part 54. The width along the X-axis direction of the fourth conductive part 54 changes in a step configuration.

Figure 12C:
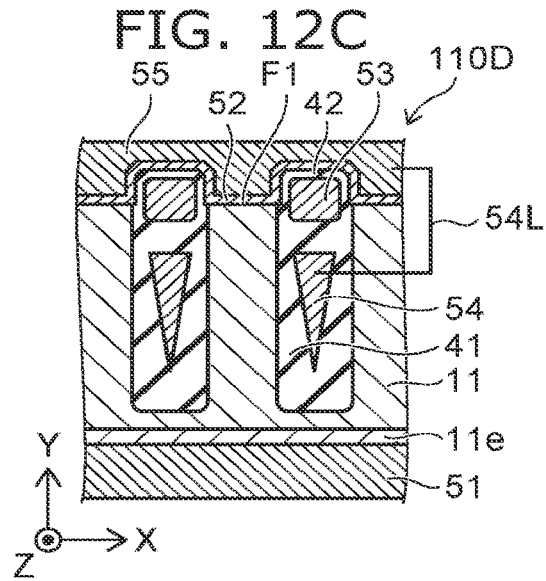

In a semiconductor device 110D as shown in FIG. 12C, the width along the X-axis direction of the fourth conductive part 54 continuously changes.

Figure 12D:
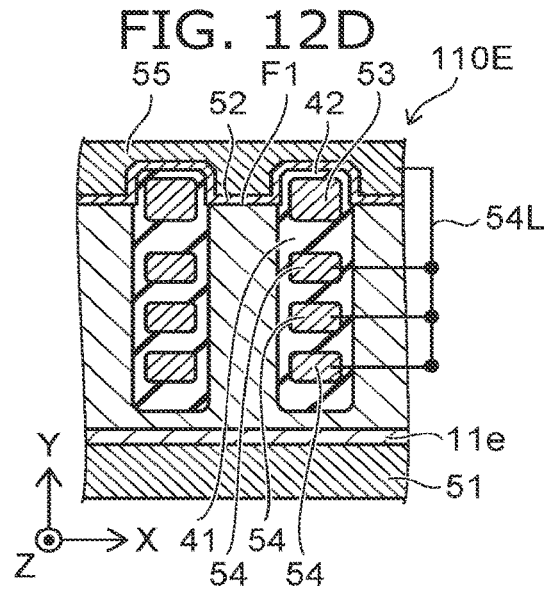

Multiple fourth conductive parts 54 are provided in a semiconductor device 110E as shown in FIG. 12D. The multiple fourth conductive parts 54 are arranged in the Y-axis direction. In one example, the multiple fourth conductive parts 54 are set to a floating state. In another example, the multiple fourth conductive parts 54 may be electrically connected to the second conductive part 52 (and the fifth conductive part 55). For example, the electrical connection may be performed by the interconnect 54L.

Figure 12E:
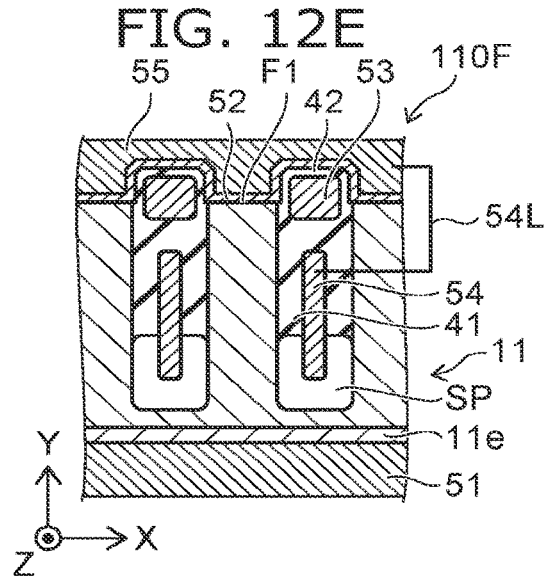

In a semiconductor device 110F as shown in FIG. 12E, a gap SP (e.g., an air gap) is provided between the fourth conductive part 54 and the first semiconductor region 11. For example, the thickness of the first insulating part 41 located between the fourth conductive part 54 and the first semiconductor region 11 may be thin. For example, the cell pitch can be reduced. For example, the current per unit area can be increased thereby.

In the embodiment, the configuration of the fourth conductive part 54 can be arbitrarily designed. The electric field distribution in the first semiconductor region 11 can be easily controlled appropriately thereby.

Figure 13:
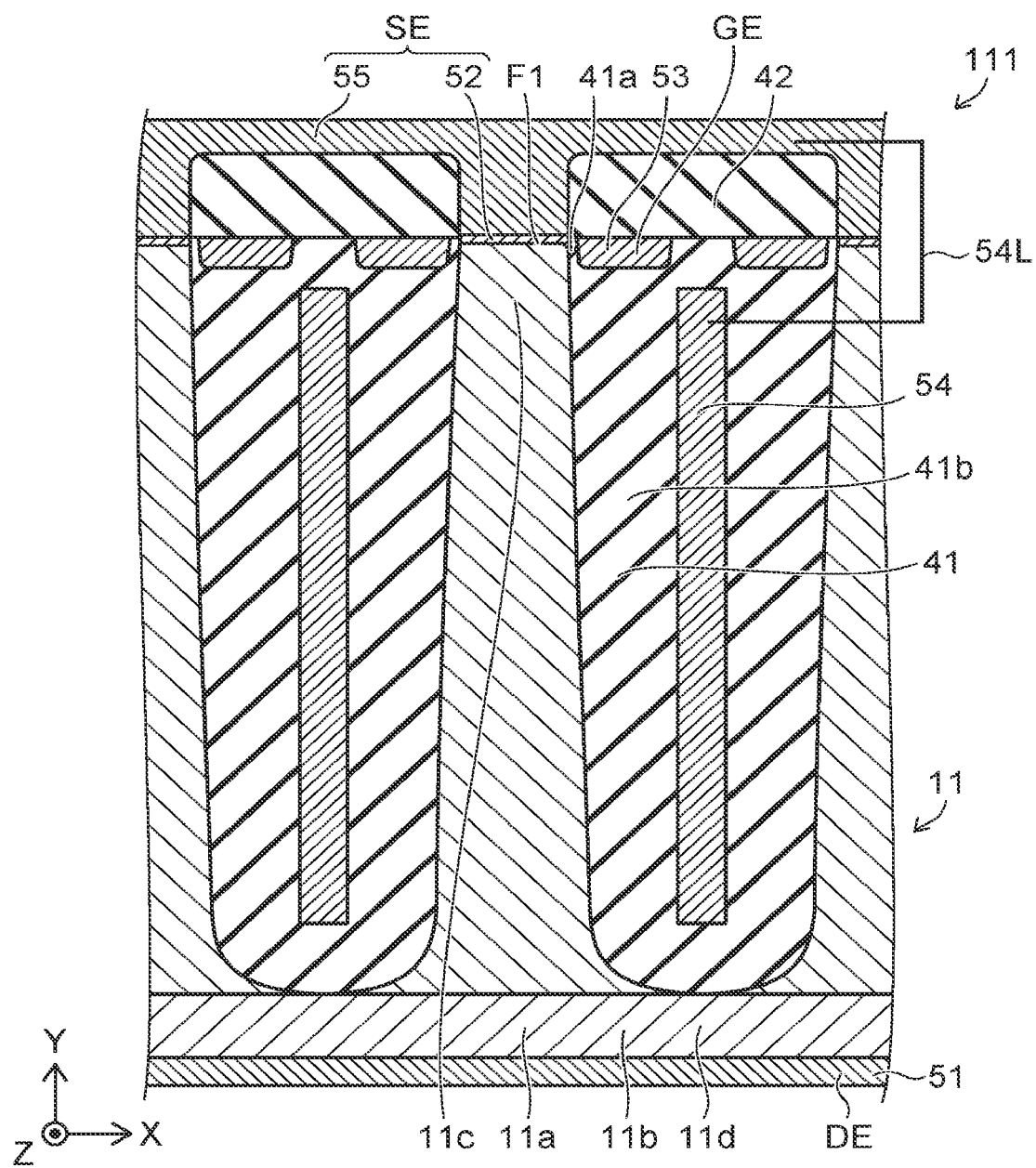
FIG. 13 is a schematic cross-sectional view illustrating a semiconductor device according to the first embodiment.

FIG. 13 is a schematic cross-sectional view illustrating a semiconductor device according to the first embodiment.

As shown in FIG. 13, the configuration of the first semiconductor region 11 of the semiconductor device 111 according to the embodiment is different from the configuration of the first semiconductor region 11 of the semiconductor device 110. Otherwise, the configuration of the semiconductor device 111 is similar to the semiconductor device 110.

In the semiconductor device 111, the first-conductivity-type impurity concentration in the fourth partial region 11d is greater than the first-conductivity-type impurity concentration in the third partial region 11c. For example, the first-conductivity-type impurity concentration in the first partial region 11a is greater than the first-conductivity-type impurity concentration in the third partial region 11c. For example, the first-conductivity-type impurity concentration in the second partial region 11b is greater than the first-conductivity-type impurity concentration in the third partial region 11c. In the semiconductor device 111 as well, a semiconductor device can be provided in which the characteristics can be improved.

Figure 14:
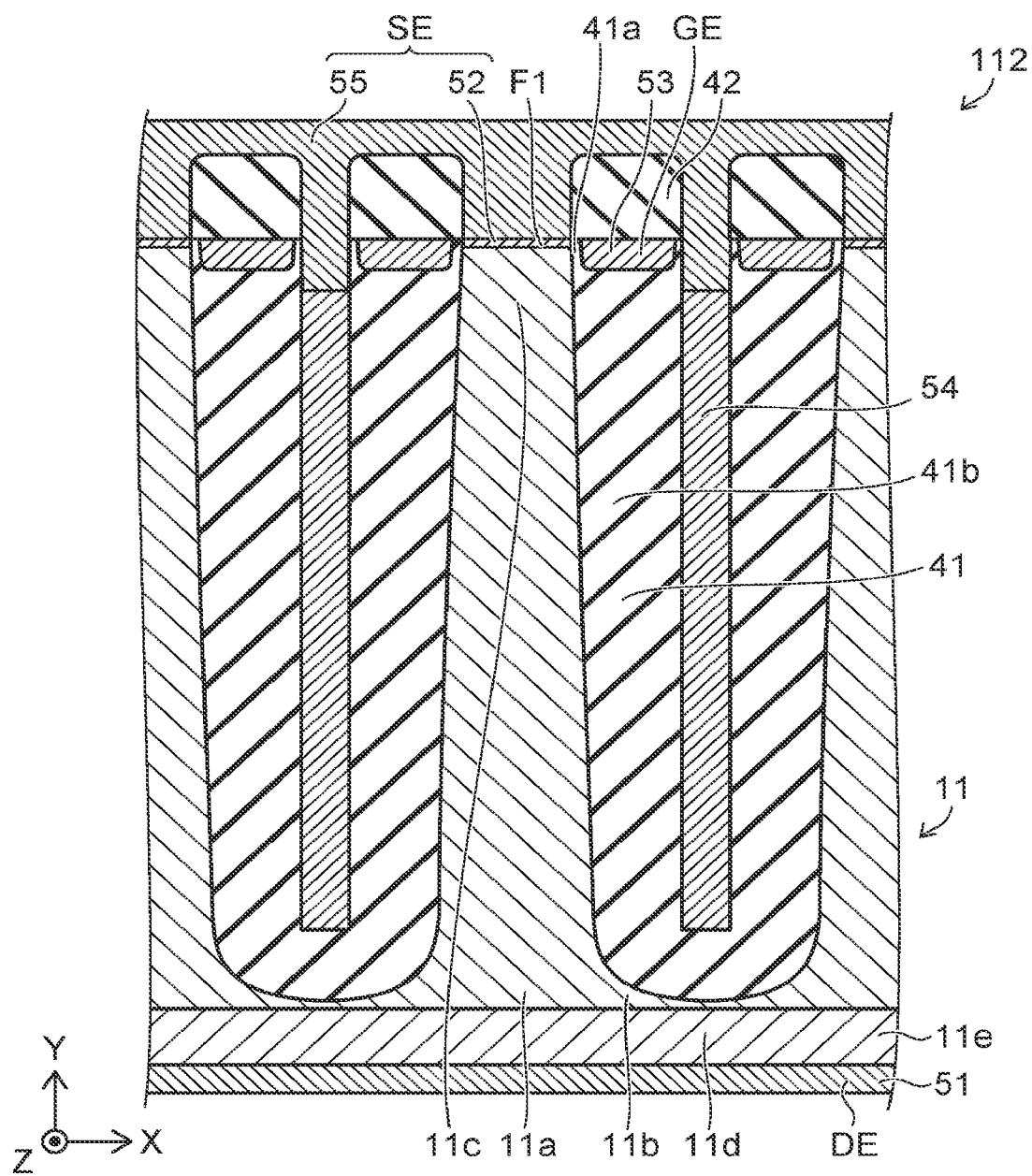
FIG. 14 is a schematic cross-sectional view illustrating a semiconductor device according to the first embodiment.

FIG. 14 is a schematic cross-sectional view illustrating a semiconductor device according to the first embodiment.

In the semiconductor device 112 according to the embodiment as shown in FIG. 14, the second insulating parts 42 are provided respectively for the multiple third conductive parts 53. For example, the fifth conductive part 55 contacts the fourth conductive part 54 by passing between two second insulating parts 42. Otherwise, the configuration of the semiconductor device 112 is similar to that of the semiconductor device 110. In the semiconductor device 112 as well, a semiconductor device can be provided in which the characteristics can be improved.

Figure 15:
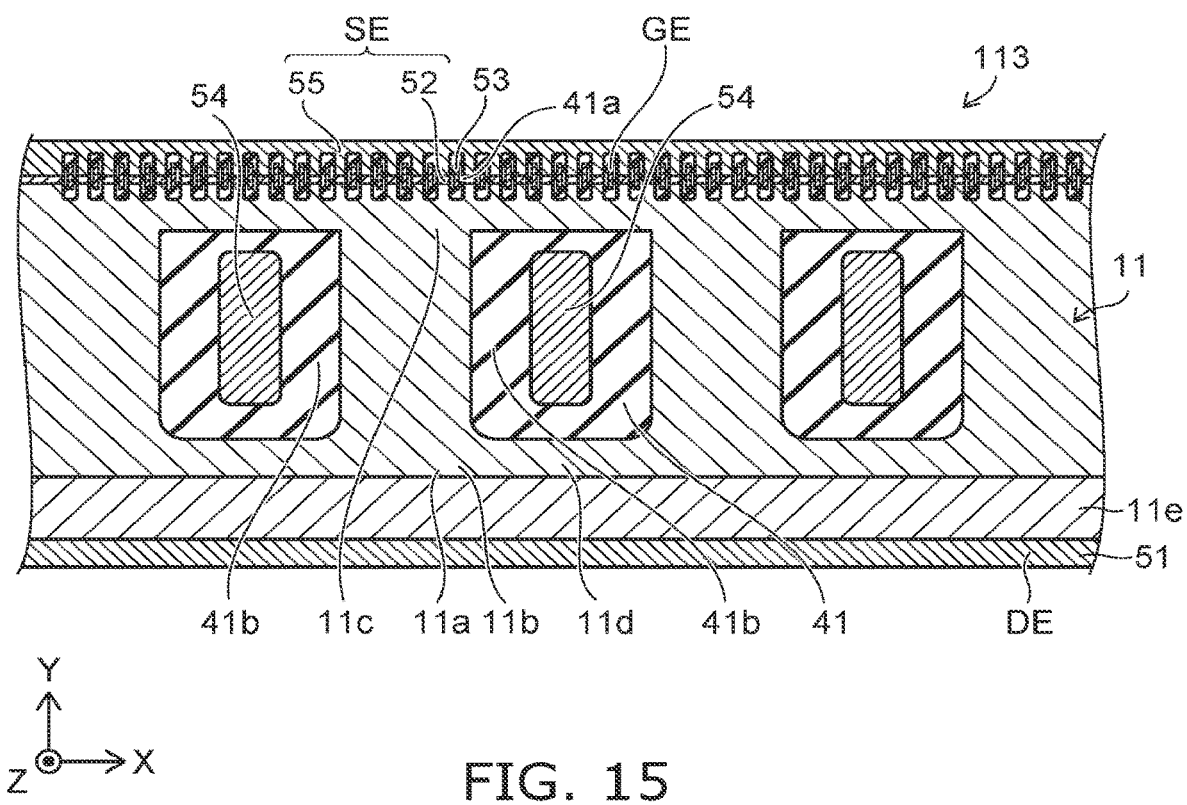
FIG. 15 is a schematic cross-sectional view illustrating a semiconductor device according to the first embodiment.

FIG. 15 is a schematic cross-sectional view illustrating a semiconductor device according to the first embodiment.

In the semiconductor device 113 according to the embodiment as shown in FIG. 15, the multiple structures illustrated in FIG. 3 are arranged in the X-axis direction. In the example, the pitch of the multiple second conductive parts 52 is less than the pitch of the multiple fourth conductive parts 54. By using such a structure, for example, the on-resistance of the drift portion (e.g., the first semiconductor region 11) can be lowered while lowering the on-resistance of the portion that includes the Schottky contact.

The multiple second conductive parts 52 and the multiple fourth conductive parts 54 are provided in the semiconductor device 113. The position in the second direction (the X-axis direction) of one of the multiple second conductive parts 52 and the position in the second direction of another one of the multiple second conductive parts 52 are between the position in the second direction of one of the multiple fourth conductive parts 54 and the position in the second direction of another one of the multiple fourth conductive parts 54. The other one of the multiple fourth conductive parts 54 is next to the one of the multiple fourth conductive parts 54.

The semiconductor device 113 described above may be manufactured by separately making a portion that includes the fourth conductive parts 54 and a portion that includes the second conductive part 52 and by bonding the two portions to each other.

Or, a portion that includes the second conductive parts 52 and the third conductive parts 53 may be formed by forming a portion that includes the fourth conductive parts 54 and by subsequently regrowing a semiconductor layer from the semiconductor region between the insulating parts. The regrowth includes, for example, "lateral growth". The semiconductor device 113 may be manufactured by such a technique.

Figure 16:
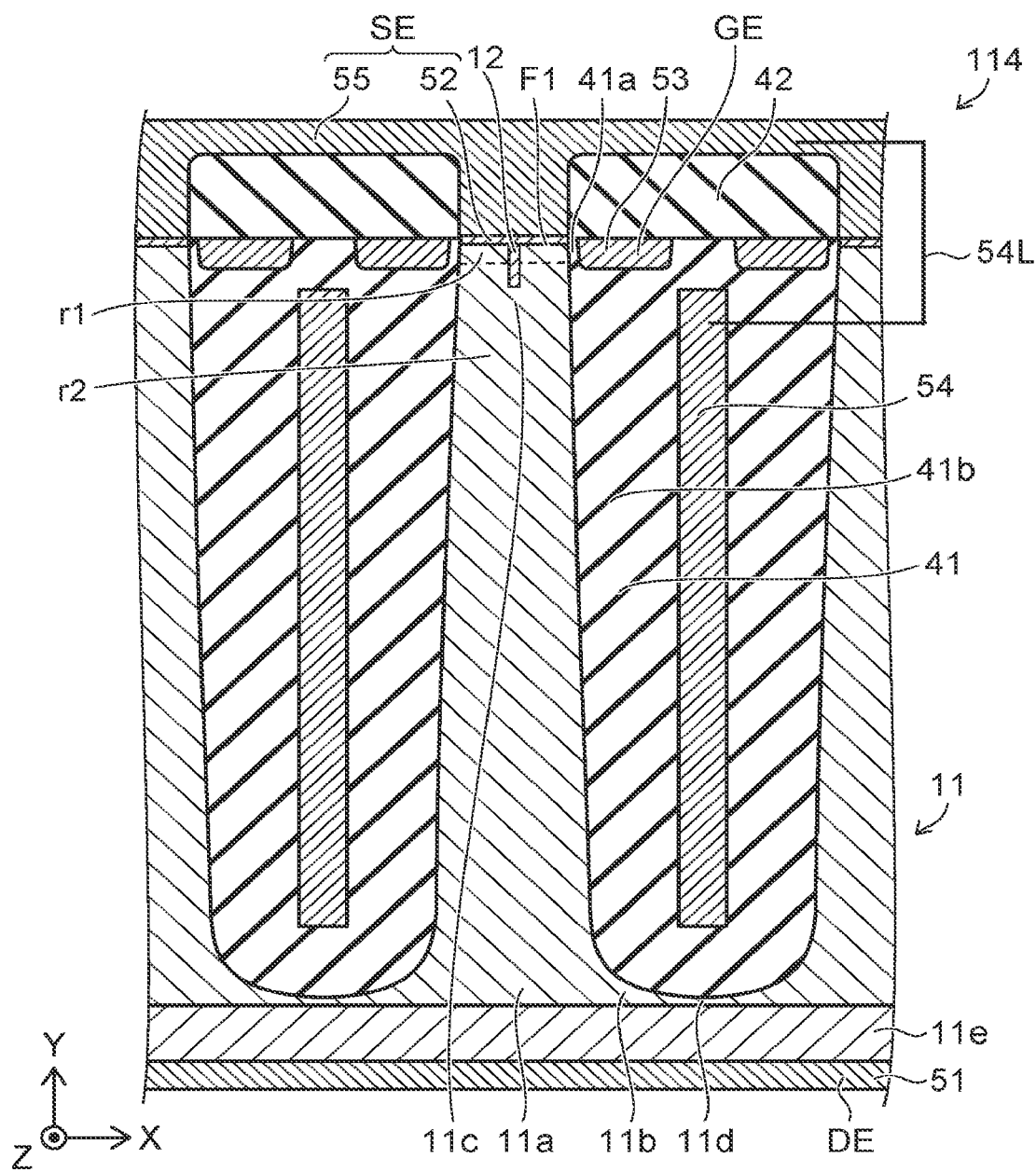
FIG. 16 is a schematic cross-sectional view illustrating a semiconductor device according to the first embodiment.

FIG. 16 is a schematic cross-sectional view illustrating a semiconductor device according to the first embodiment.

As shown in FIG. 16, the semiconductor device 114 according to the embodiment includes a second semiconductor region 12. Otherwise, the configuration of the semiconductor device 114 may be similar to that of the semiconductor device 110.

The second semiconductor region 12 is of a second conductivity type (e.g., a p-type). The second semiconductor region 12 is between the second conductive part 52 and a portion of the third partial region 11c in the first direction (the Y-axis direction). Another portion of the third partial region 11c is between the second semiconductor region 12 and the first insulating region 41a in the second direction (e.g., the X-axis direction).

For example, the leakage current can be reduced by providing the second semiconductor region 12. When the second semiconductor region 12 includes silicon, the second-conductivity-type impurity includes, for example, at least one selected from the group consisting of boron, gallium, and indium.

Figure 17:
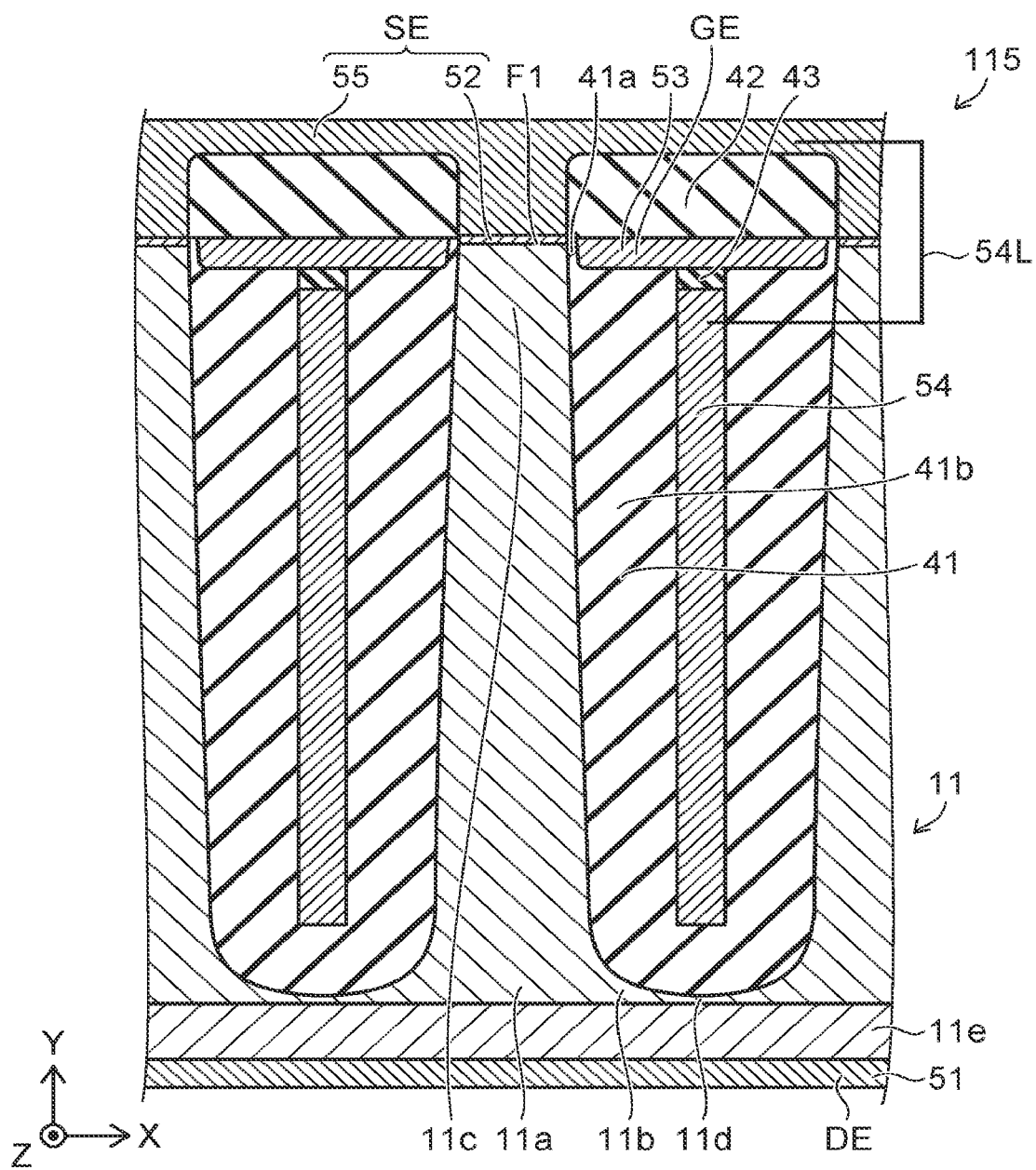
FIG. 17 is a schematic cross-sectional view illustrating a semiconductor device according to the first embodiment.

FIG. 17 is a schematic cross-sectional view illustrating a semiconductor device according to the first embodiment.

In the semiconductor device 115 according to the embodiment as shown in FIG. 17, one third conductive part 53 overlaps the fourth conductive part 54 and two regions of the first insulating part 41 in the Y-axis direction. A third insulating part 43 is provided between the fourth conductive part 54 and the third conductive part 53. Otherwise, the configuration of the semiconductor device 115 may be similar to that of the semiconductor device 110. In the semiconductor device 115 as well, a semiconductor device can be provided in which the characteristics can be improved.

Figure 18:
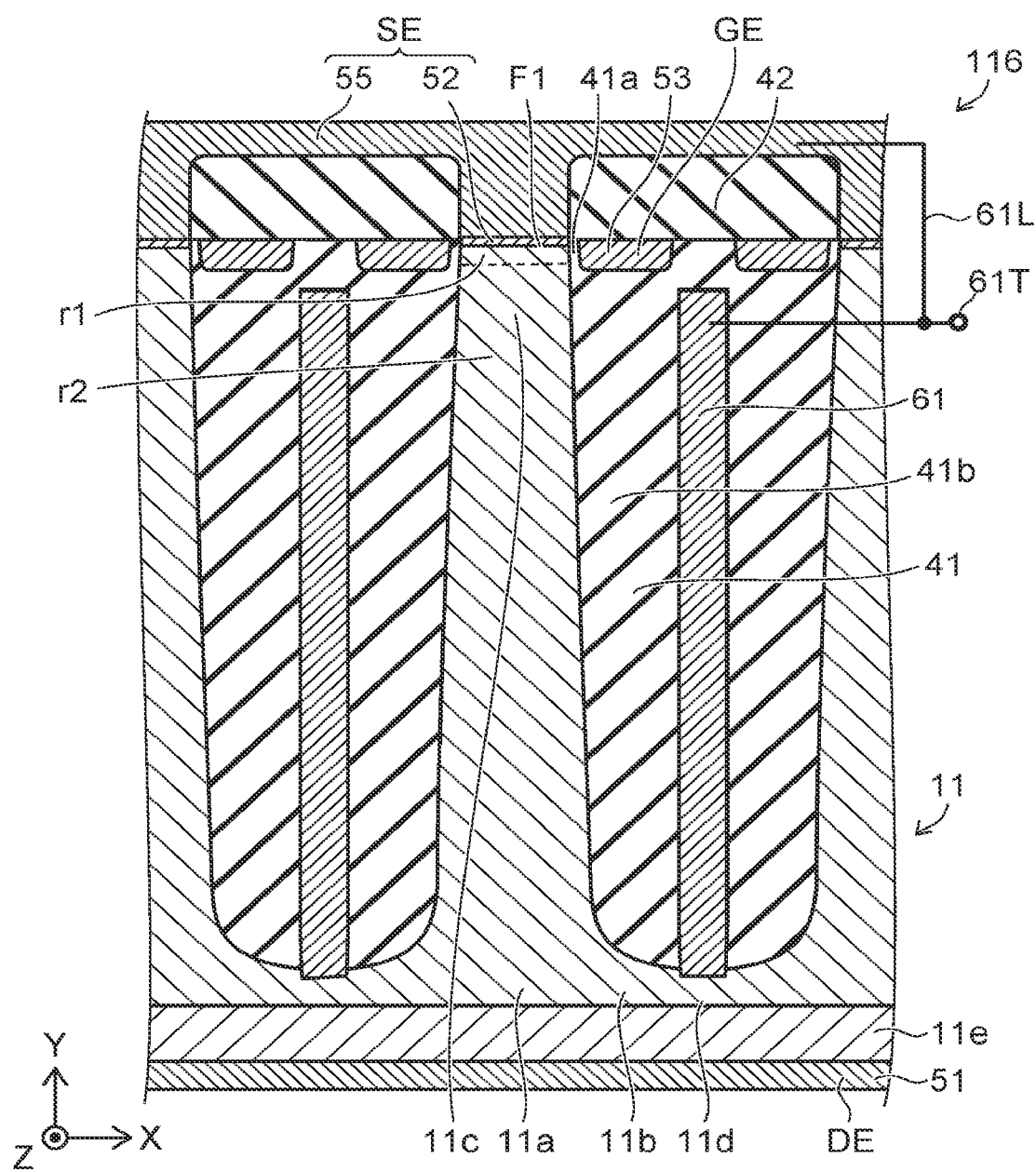
FIG. 18 is a schematic cross-sectional view illustrating a semiconductor device according to the first embodiment.

FIG. 18 is a schematic cross-sectional view illustrating a semiconductor device according to the first embodiment.

As shown in FIG. 18, the semiconductor device 116 according to the embodiment includes a first member 61 in addition to the first to third conductive parts 51 to 53, the first semiconductor region 11, and the first insulating part 41. Otherwise, the configuration of the semiconductor device 116 may be similar to that of the semiconductor device 110.

As shown in FIG. 18, the first semiconductor region 11 includes the first to fourth partial regions 11a to 11d. In the example, the first semiconductor region 11 further includes the fifth partial region 11e. The second partial region 11b is between the first partial region 11a and the fourth partial region 11d in the second direction (the X-axis direction). The direction from the fourth partial region 11d toward the first member 61 is along the first direction (the Y-axis direction). The direction from at least a portion of the third partial region 11c toward the first member 61 is along the second direction (the X-axis direction). The first insulating part 41 includes the second insulating region 41b. The second insulating region 41b is between the first member 61 and at least a portion of the third partial region 11c in the second direction (the X-axis direction).

For example, the first member 61 is electrically connected with the fourth partial region 1id. For example, the lower end portion of the first member 6.1 (an end portion of a side of the first conductive part 51) is connected with the fourth partial region 11d. For example, the lower end portion of the first member 61 contacts the fourth partial region 11d. For example, the first member 61 is electrically connected to the fifth conductive part 55. The first member 61 is electrically connected to the second conductive part 52. Or, the first member 61 is capable of being electrically connected to the second conductive part 52. For example, the first member 61 may be electrically connected to the second conductive part 52 via the fifth conductive part 55 by an interconnect 61L. For example, a terminal 61T may be provided in the interconnect 61L; and the terminal 61T and the second conductive part 52 may be connected outside the semiconductor device 116.

The resistivity of the first member 61 is greater than the resistivity of the fourth partial region 11d and less than the resistivity of the second insulating region 41b. For example, the resistivity of the first member 61 is not less than $5 \times 10^7$ $\Omega$m and not more than $8 \times 10^{11}$ $\Omega$m.

According to the embodiment, for example, a micro current can flow in the first member 61 in the off-state. For example, the electric field in the third partial region 11c can be made uniform thereby. For example, a source-drain charge amount Qoss can be reduced. For example, the loss can be suppressed thereby. For example, the power consumption can be reduced. For example, the electric field that is applied to the gate insulating film can be reduced. For example, high reliability is obtained. According to the embodiment, for example, a semiconductor device can be provided in which the characteristics can be improved.

The first member 61 may include various materials such as the following. The first member 61 includes, for example, at least one selected from the group consisting of a first material, a second material, a third material, a fourth material, a fifth material, and a sixth material. The first material includes, for example, Si, N, and O.

The second material includes, for example, Si, N, and O. The second material includes, for example, a Si—N bond, a N—O bond, and a N—N bond. The second material includes, for example, oxygen-doped SIPOS (Semi-insulating Poly-crystalline Silicon). The second material is, for example, a mixed material of $SiH_4$, $N_2O$, and $N_2$.

The third material includes Si, N, and O. The third material includes, for example, a Si—N bond, a N—H bond, and a N—N bond. The third material is, for example, nitrogen-doped SIPOS. The third material is a mixed material of $SiH_4$, $NH_3$, and $N_2$.

The fourth material includes, for example, Si, C, and a first element. The first element includes at least one selected from the group consisting of B and N. The fifth material includes, for example, Si, O, and a second element. The second element includes at least one selected from the group consisting of Fe, Au, Ni, Ta, W, and Ti. The sixth material includes, for example, a third element and a fourth element. The third element includes at least one selected from the group consisting of In, Al, and Ga. The fourth element includes at least one selected from the group consisting of P, As, B, Fe, Au, Ni, Ta, W, and Ti.

By using such materials, for example, the first member 61 can have an appropriate resistivity. Thereby, as described above, a semiconductor device can be provided in which the characteristics can be improved.

Second Embodiment

Figure 19:
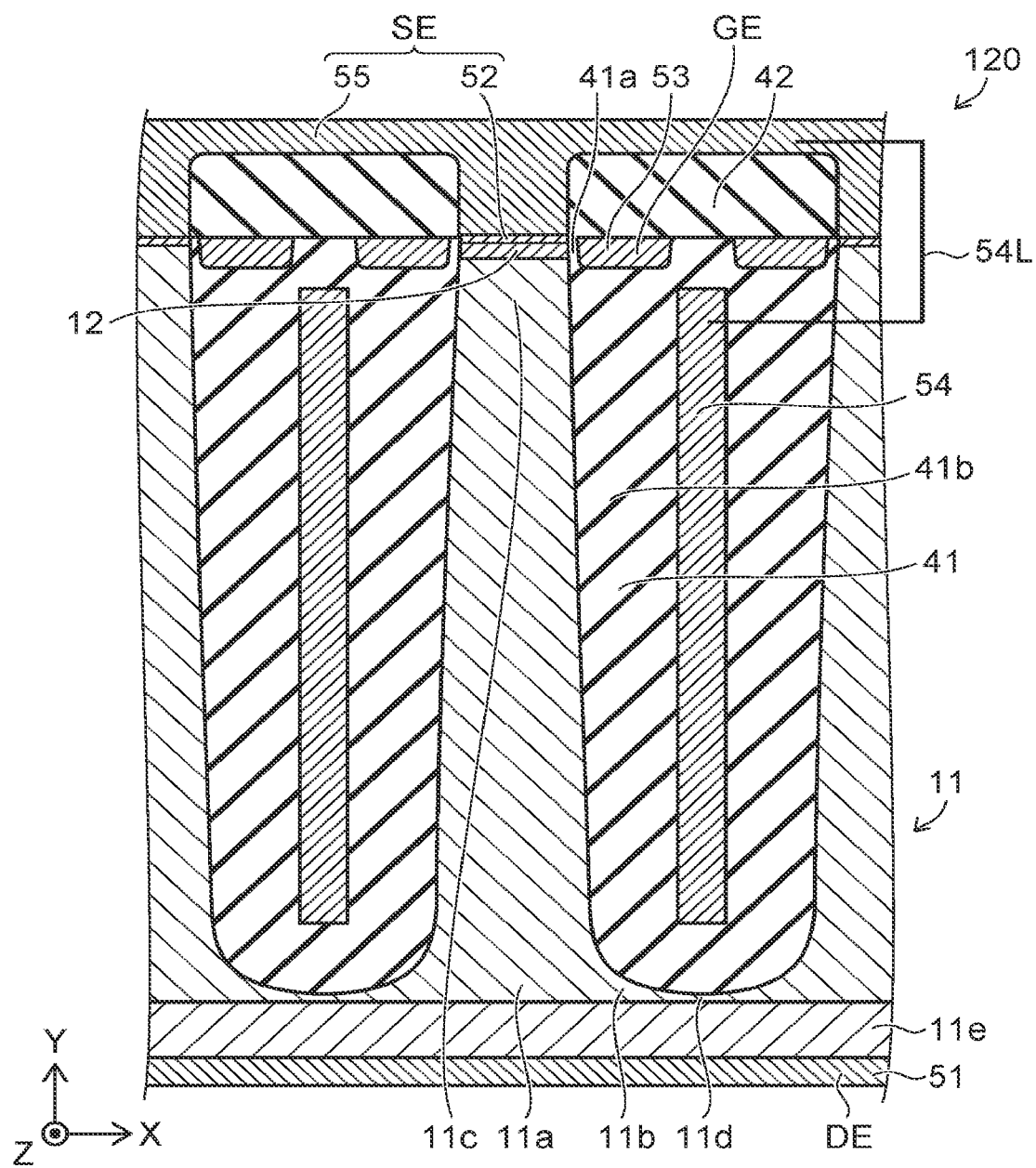
FIG. 19 is a schematic cross-sectional view illustrating a semiconductor device according to a second embodiment.

FIG. 19 is a schematic cross-sectional view illustrating a semiconductor device according to a second embodiment.

As shown in FIG. 19, the semiconductor device 120 according to the embodiment includes the supporter 50S (referring to FIG. 1), the first conductive part 51, the second conductive part 52, the first semiconductor region 11, the second semiconductor region 12, the third conductive part 53, and the first insulating part 41. The supporter 50S is not illustrated in FIG. 19.

The first direction from the first conductive part 51 toward the second conductive part 52 is along the first surface 50F of the supporter 50S (referring to FIG. 1). The first direction is, for example, the Y-axis direction.

The first semiconductor region 11 is of the first conductivity type (e.g., the n-type). The first semiconductor region 11 includes the first partial region 11a, the second partial region 11b, and the third partial region 11c. The second direction from the first partial region 11a toward the second partial region 11b is along the first surface 50F (referring to FIG. 1) and crosses the first direction. The second direction is, for example, the X-axis direction. The third partial region 11c is between the first partial region 11a and the second conductive part 52 in the first direction (the Y-axis direction).

The second semiconductor region 12 is located between the third partial region 11c and the second conductive part 52. The second semiconductor region 12 is of the second conductivity type (e.g., the p-type). The direction from at least a portion of the second semiconductor region 12 toward the third conductive part 53 is along the second direction (e.g., the X-axis direction). The first insulating part 41 includes the first insulating region 41a. At least a portion of the first insulating region 41a is between the third conductive part 53 and at least a portion of the second semiconductor region 12.

The semiconductor device 120 is, for example, a p-n-type transistor. The height of the barrier formed between the first semiconductor region 11 and the second semiconductor region 12 can be controlled by the potential of the third conductive part 53. In the semiconductor device 120 as well, for example, the total gate charge amount (Qg) is small. For example, the gate capacitance (Cg) and the gate-drain capacitance (Cgd) are reduced. The total gate charge amount (Qg) and the gate-drain charge amount (Qgd) are reduced thereby. For example, the loss of the gate driver can be reduced. For example, the switching can be faster. For example, the turn-on loss and the turn-off loss can be suppressed. A semiconductor device can be provided in which the characteristics can be improved.

In the semiconductor device 120, the second conductive part 52 may be continuous with the fifth conductive part 55. The second conductive part 52 may be a continuous body with the fifth conductive part 55.

Third Embodiment

An example of a semiconductor device according to a third embodiment will now be described. In the third embodiment as well, the first semiconductor region 11, the drain electrode DE (the first conductive part 51), the source electrode SE (the second conductive part 52 and the fifth conductive part 55), and the gate electrode GE (the third conductive part 53) are located on the supporter 50S (referring to FIG. 1, FIG. 2, etc.). The supporter 50S is not illustrated in some of the following drawings.

Figure 20:
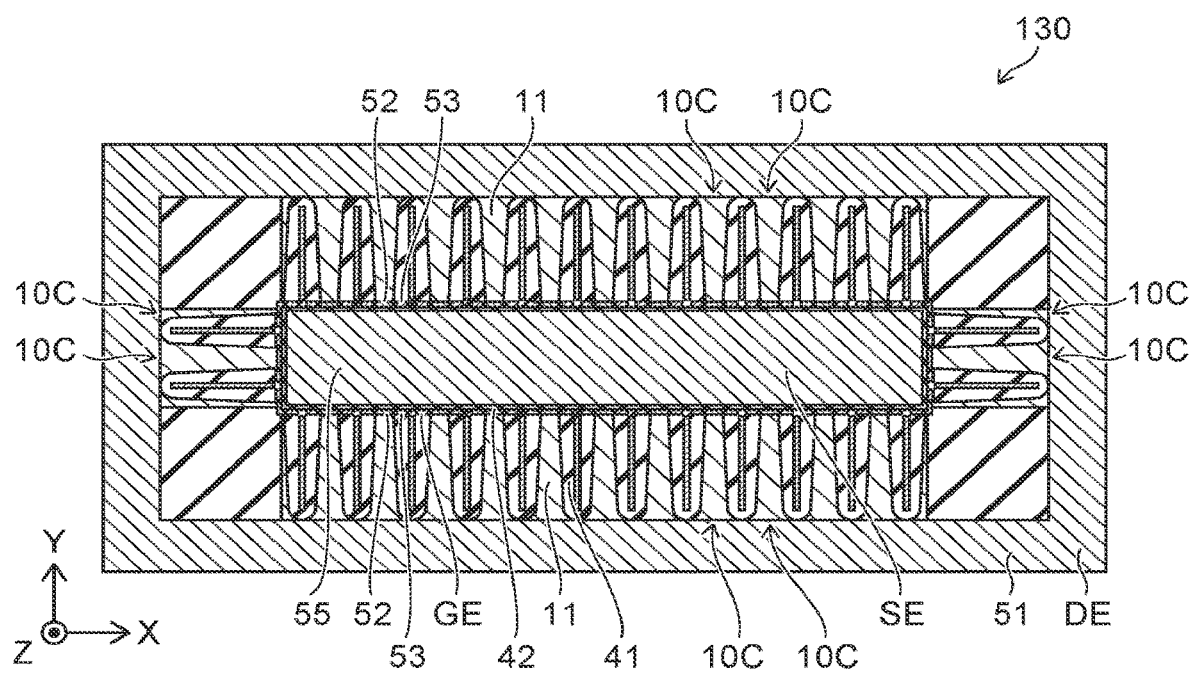
FIG. 20 is a schematic cross-sectional view illustrating a semiconductor device according to a third embodiment.

FIG. 20 is a schematic cross-sectional view illustrating the semiconductor device according to the third embodiment.

In the semiconductor device 130 according to the embodiment as shown in FIG. 20, a ring-shaped drain electrode DE is provided around the source electrode SE in the X-Y plane. Multiple cells 10C are provided between the source electrode SE and the ring-shaped drain electrode DE. One of the multiple cells 10C includes the second conductive part 52. One of the multiple cells 10C may be considered to include one of the multiple third conductive parts 53 and one of the multiple fourth conductive parts 54.

In the semiconductor device 130, the multiple cells 10C can be provided with a high density. In the semiconductor device 130, the multiple cells 10C are continuous in a ring shape in the X-Y plane. Therefore, a terminal region does not exist in the semiconductor device 130. The surface area for the terminal region can be omitted thereby, and the multiple cells 10C can be provided with a higher density.

Figure 21:
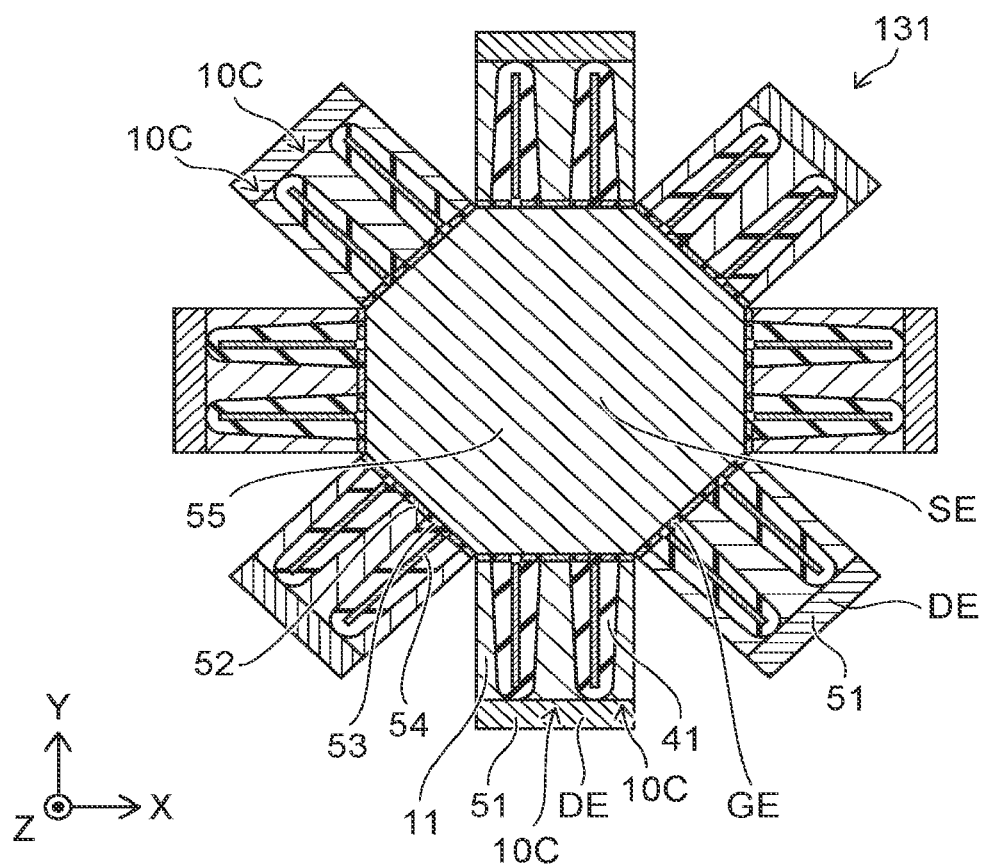
FIG. 21 is a schematic cross-sectional view illustrating a semiconductor device according to the third embodiment.

FIG. 21 is a schematic cross-sectional view illustrating a semiconductor device according to the third embodiment.

As shown in FIG. 21, in the semiconductor device 131 according to the embodiment as well, multiple drain electrodes DE are provided around the source electrode SE in the X-Y plane. A direction that connects two of the multiple drain electrodes DE crosses a direction that connects another two of the multiple drain electrodes DE. In the semiconductor device 131 as well, the multiple cells 10C that have a high density are obtained. In the semiconductor device 131, the multiple drain electrodes DE may be continuous with each other.

Figure 22:
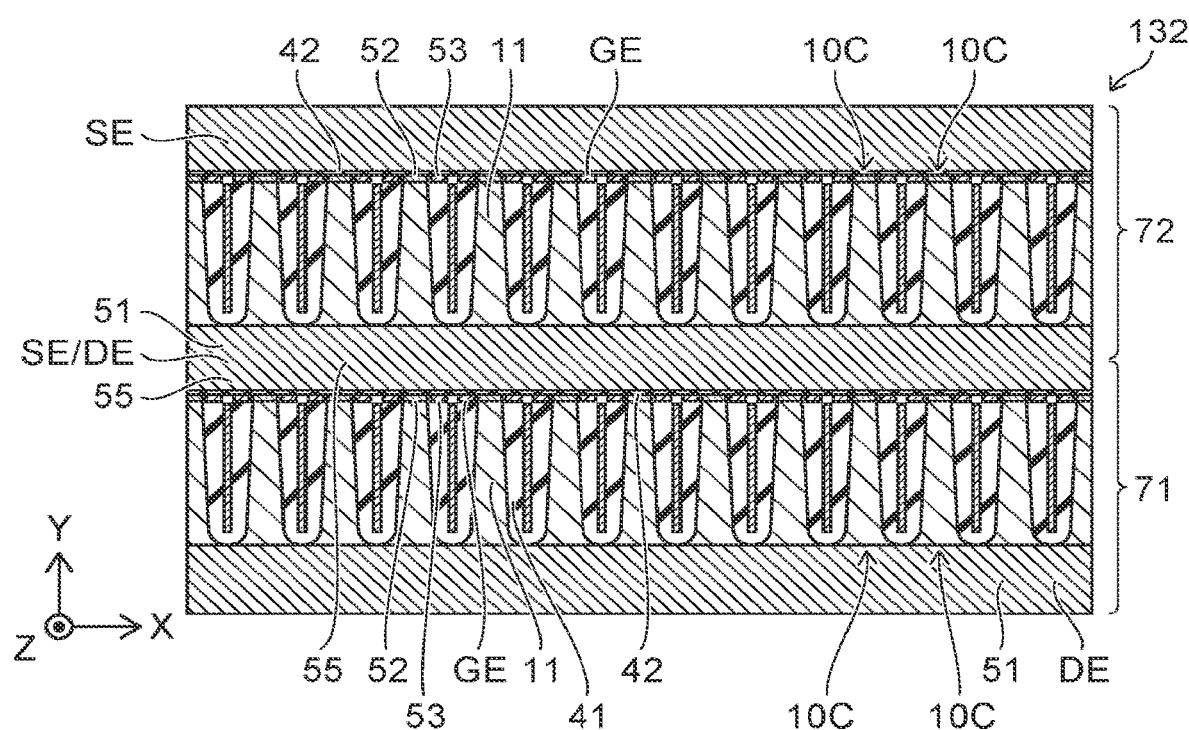
FIG. 22 is a schematic cross-sectional view illustrating a semiconductor device according to the third embodiment.

FIG. 22 is a schematic cross-sectional view illustrating a semiconductor device according to the third embodiment.

As shown in FIG. 22, multiple cell groups (a first cell group 71 and a second cell group 72) are provided in the semiconductor device 132 according to the embodiment. In the example, the orientation from the first cell group 71 toward the second cell group 72 is the Y-axis direction. The first cell group 71 and the second cell group 72 each include the multiple cells 10C. The multiple cells 10C are arranged in the X-axis direction. For example, the fifth conductive part 55 of the first cell group 71 is continuous with the first conductive part 51 of the second cell group 72. For example, the conductive part SE/DE that is located between the first semiconductor region 11 included in the first cell group 71 and the first semiconductor region 11 included in the second cell group 72 may be considered to be the fifth conductive part 55 of the first cell group 71 and the first conductive part 51 of the second cell group 72.

The first cell group 71 is, for example, a transistor group at a low-voltage side. The second cell group 72 is a transistor group at a high-voltage side. For example, the semiconductor device 132 can control a high voltage.

Figure 23:
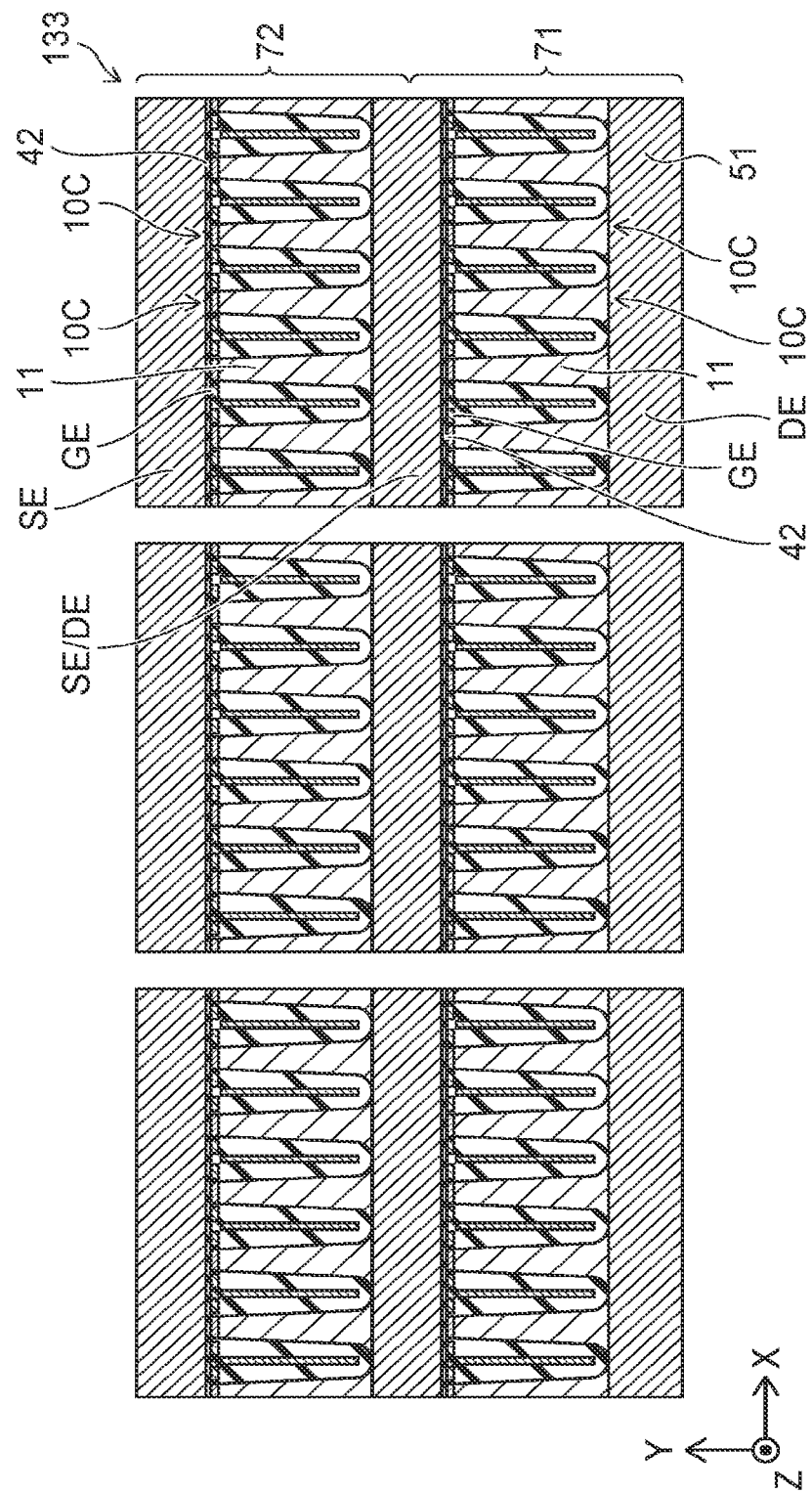
FIG. 23 is a schematic cross-sectional view illustrating a semiconductor device according to the third embodiment.

FIG. 23 is a schematic cross-sectional view illustrating a semiconductor device according to the third embodiment.

As shown in FIG. 23, multiple configurations of the semiconductor devices 132 illustrated in FIG. 22 are provided in the semiconductor device 133 according to the embodiment. The configurations of the multiple semiconductor devices 132 are arranged in the X-axis direction.

Figure 24:
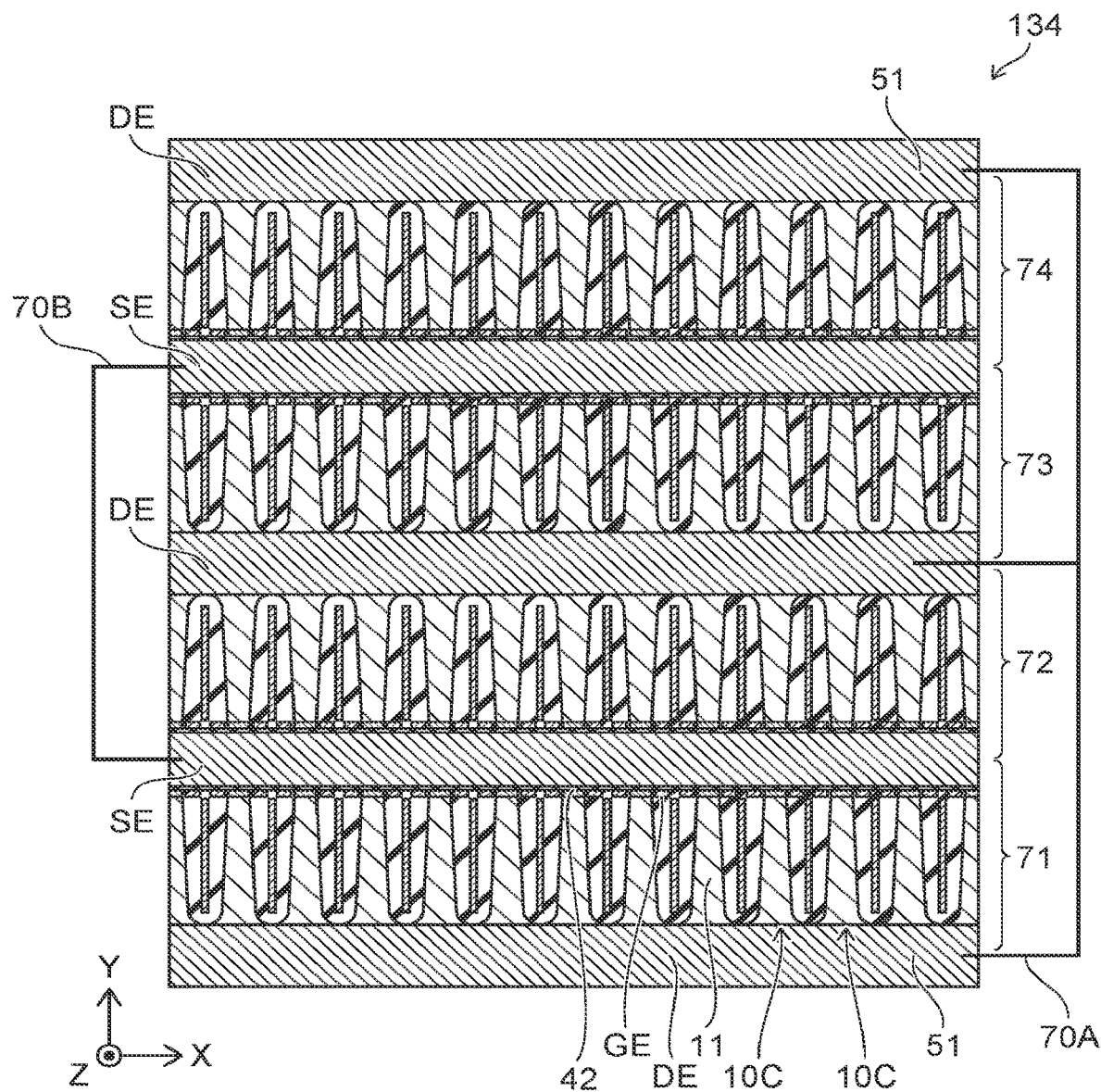
FIG. 24 is a schematic cross-sectional view illustrating a semiconductor device according to the third embodiment.

FIG. 24 is a schematic cross-sectional view illustrating a semiconductor device according to the third embodiment.

As shown in FIG. 24, multiple cell groups (the first to fourth cell groups 71 to 74) are provided in the semiconductor device 134 according to the embodiment. The second cell group 72 is between the first cell group 71 and the fourth cell group 74. The third cell group 73 is between the second cell group 72 and the fourth cell group 74.

The orientation from the drain electrode DE (the first conductive part 51) of the first cell group 71 toward the source electrode SE (the second conductive part 52) of the first cell group 71 is the reverse of the orientation from the drain electrode DE (the first conductive part 51) of the second cell group 72 toward the source electrode SE (the second conductive part 52) of the second cell group 72. The orientation from the drain electrode DE (the first conductive part 51) of the third cell group 73 toward the source electrode SE (the second conductive part 52) of the third cell group 73 is the reverse of the orientation from the drain electrode DE (the first conductive part 51) of the fourth cell group 74 toward the source electrode SE (the second conductive part 52) of the fourth cell group 74. The orientation from the drain electrode DE (the first conductive part 51) of the first cell group 71 toward the source electrode SE (the second conductive part 52) of the first cell group 71 is the same as the orientation from the drain electrode DE (the first conductive part 51) of the third cell group 73 toward the source electrode SE (the second conductive part 52) of the third cell group 73.

The drain electrode DE is shared between the second cell group 72 and the third cell group 73. The source electrode SE is shared between the first cell group 71 and the second cell group 72. The source electrode SE is shared between the third cell group 73 and the fourth cell group 74. In the example, the drain electrodes DE of the first to fourth cell groups 71 to 74 are electrically connected to each other by an interconnect 70A. In the example, the source electrodes SE of the first to fourth cell groups 71 to 74 are electrically connected to each other by an interconnect 70B. According to the semiconductor device 134, the multiple cells 10C can be provided with a high density.

Figure 25:
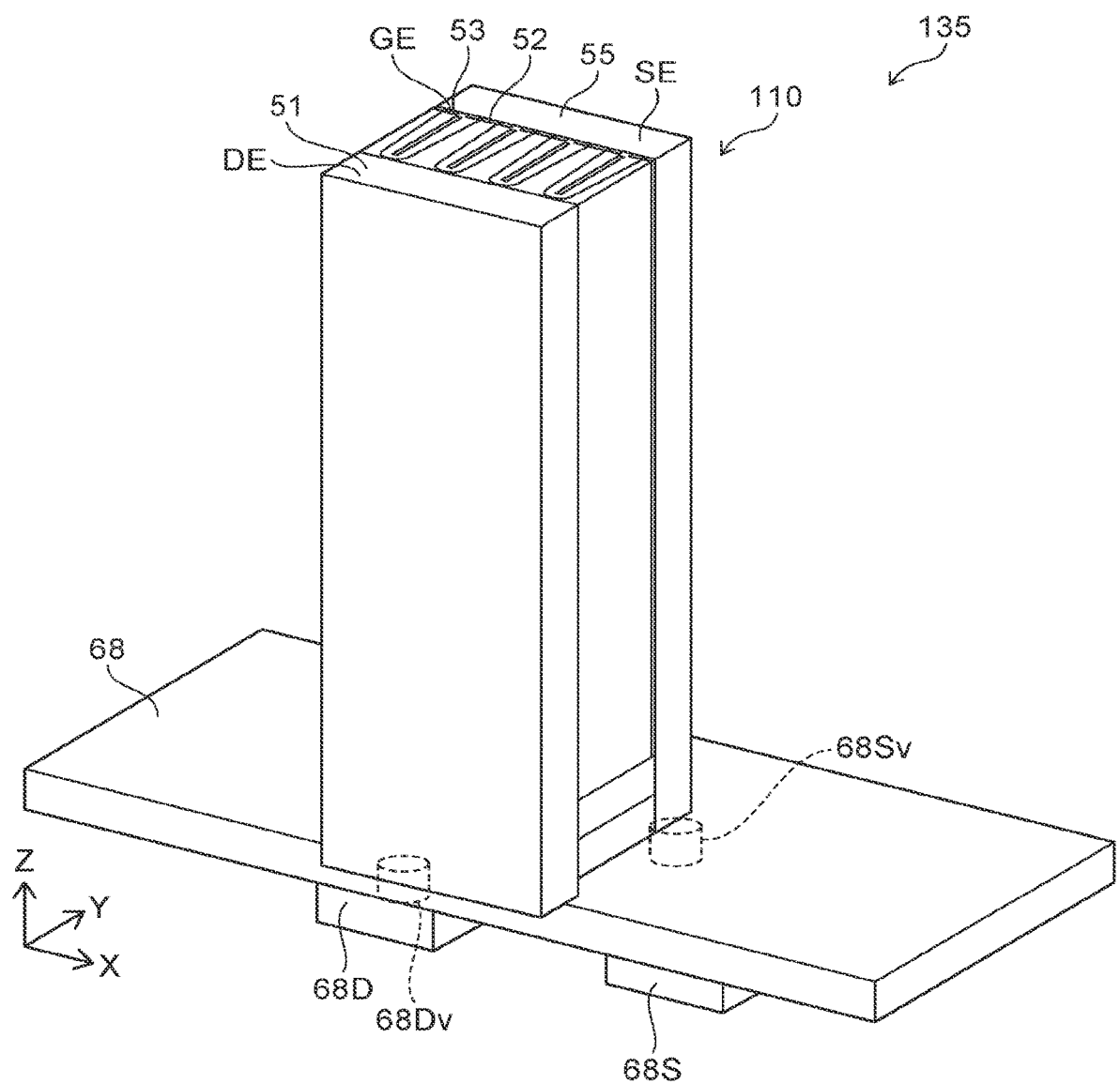
FIG. 25 is a schematic perspective view illustrating a semiconductor device according to the third embodiment.

FIG. 25 is a schematic perspective view illustrating a semiconductor device according to the third embodiment.

As shown in FIG. 25, the semiconductor device 135 according to the embodiment further includes a base body 68 in addition to the configuration of the semiconductor device 110. For example, the configuration of the semiconductor device 110 is provided on the base body 68. An electrode 68S for the source and an electrode 68D for the drain are provided under the base body 68. For example, a source connection member 68Sv and a drain connection member 68Dv are provided. The source connection member 68Sv and the drain connection member 68Dv extend in the Z-axis direction through the base body 68. The source connection member 68Sv electrically connects the source electrode SE and the electrode 68S for the source. The drain connection member 68Dv electrically connects the drain electrode DE and the electrode 68D for the drain.

Figure 26:
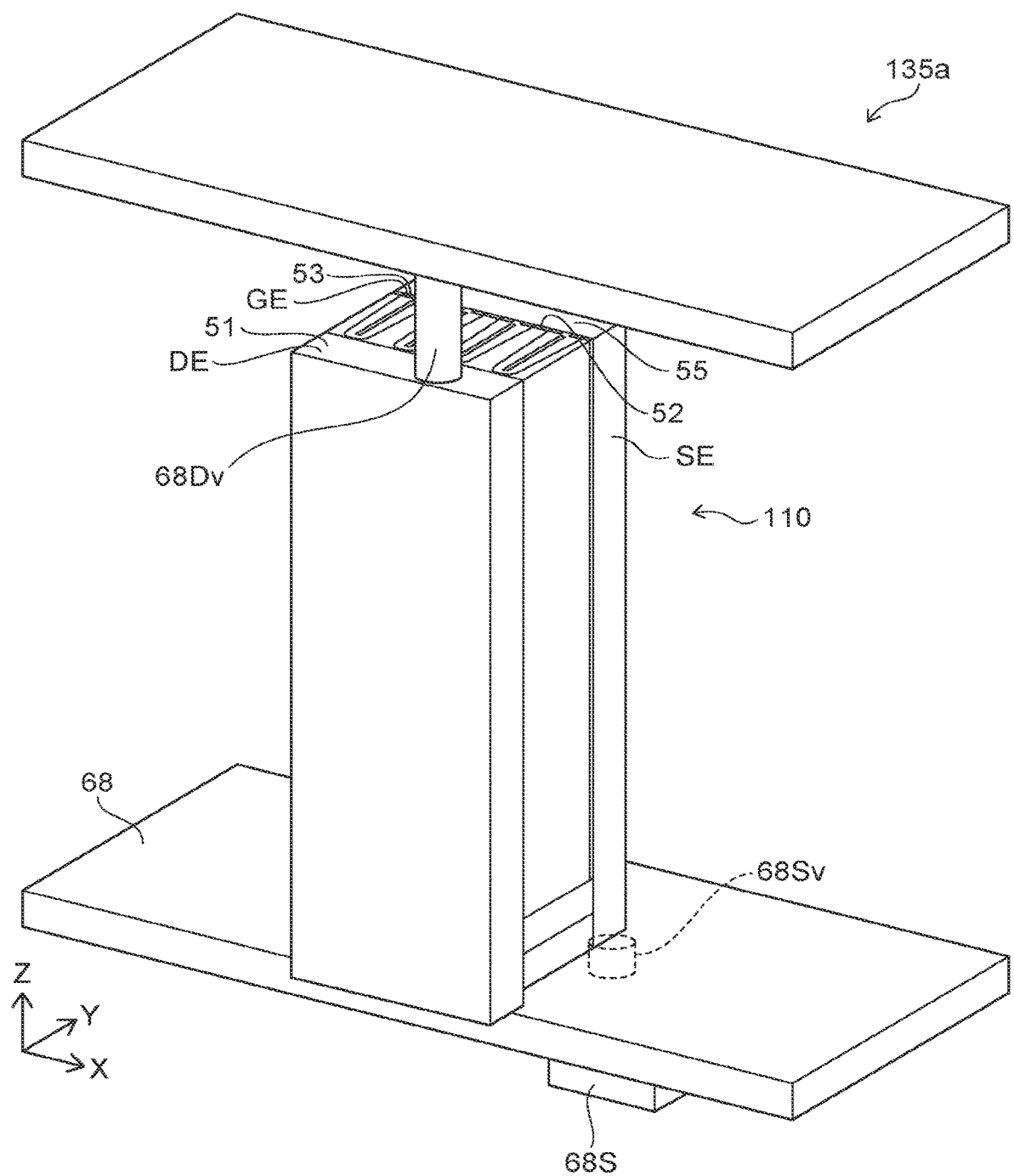
FIG. 26 is a schematic perspective view illustrating a semiconductor device according to the third embodiment.

FIG. 26 is a schematic perspective view illustrating a semiconductor device according to the third embodiment.

As shown in FIG. 26, the connection position of the drain connection member 68Dv in the semiconductor device 135a according to the embodiment is different from the connection position of the drain connection member 68Dv in the semiconductor device 135. In the semiconductor device 135a, the position in the Z-axis direction of the drain electrode DE is between the position in the Z-axis direction of the source connection member 68Sv and the position in the Z-axis direction of the drain connection member 68Dv.

Figure 27:
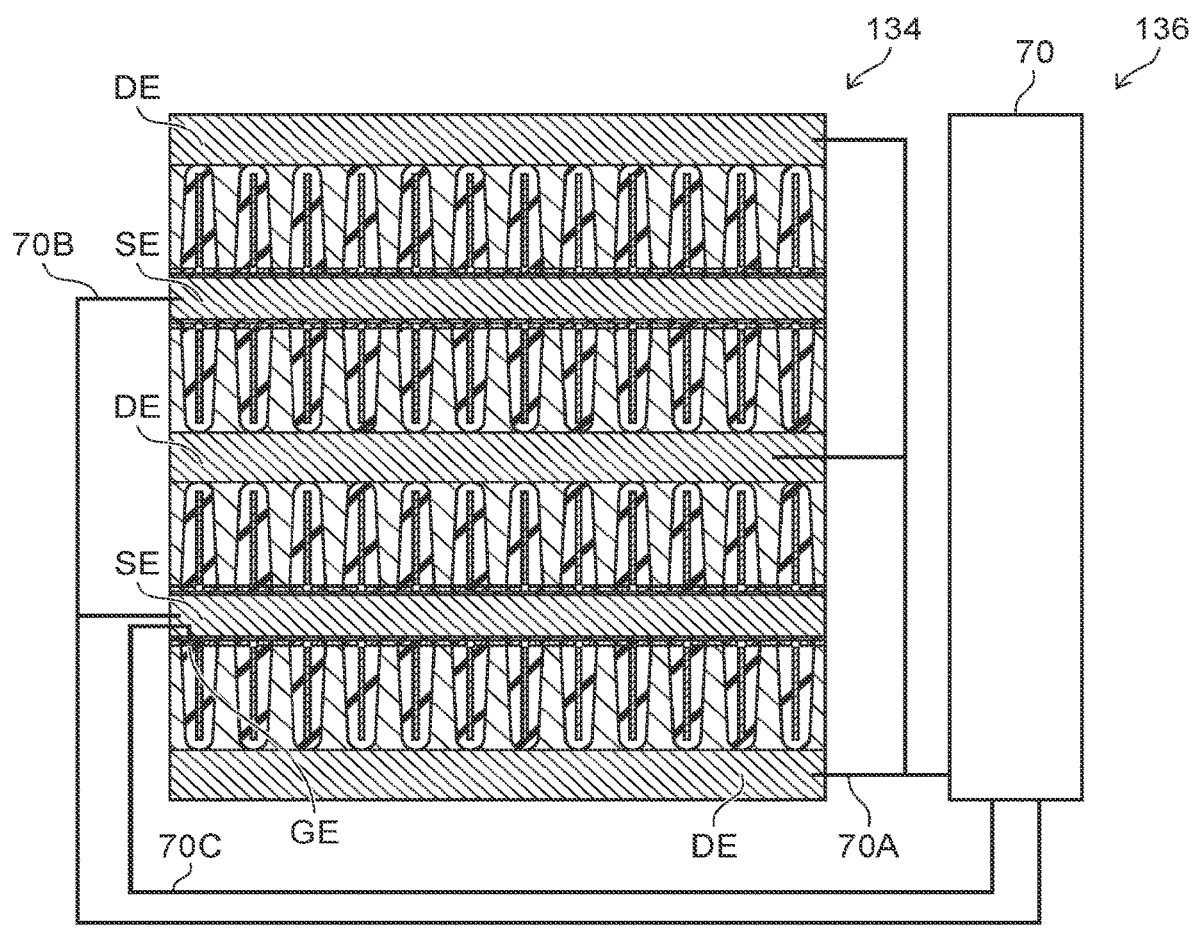
FIG. 27 is a schematic cross-sectional view illustrating a semiconductor device according to the third embodiment.

FIG. 27 is a schematic cross-sectional view illustrating a semiconductor device according to the third embodiment.

As shown in FIG. 27, the semiconductor device 136 according to the embodiment further includes a controller 70 in addition to the configuration of the semiconductor device 134. For example, the controller 70 is electrically connected to the drain electrode DE by the interconnect 70A. For example, the controller 70 is electrically connected to the source electrode SE by the interconnect 70B. For example, the controller 70 is electrically connected to the gate electrode GE by an interconnect 70C.

Figure 28:
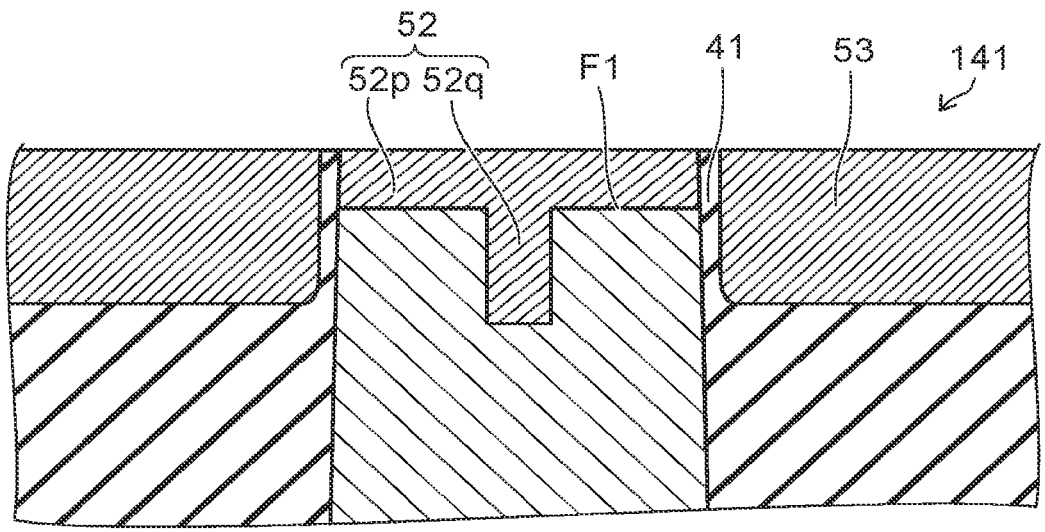
FIG. 28 is a schematic cross-sectional view illustrating semiconductor device according to the embodiment.
Figure 29:
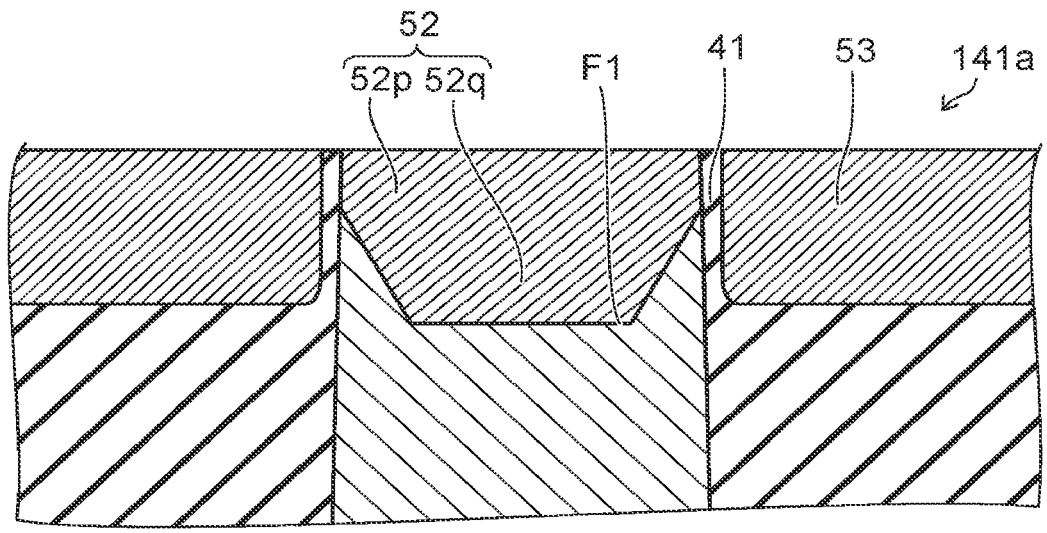
FIG. 29 is a schematic cross-sectional view illustrating semiconductor device according to the embodiment.

FIGS. 28 and 29 are schematic cross-sectional views illustrating semiconductor devices according to the embodiment.

In the semiconductor devices 141 and 141a according to the embodiment as shown in FIGS. 28 and 29, the second conductive part 52 includes a first conductive portion 52p and a second conductive portion 52q. The second conductive portion 52q is between the third partial region 11c and the first conductive portion 52p. The direction from the second conductive portion 52q toward a portion of the third partial region 11c is along the X-axis direction. The direction from the second conductive portion 52q toward at least a portion of the third conductive part 53 is along the X-axis direction. In the example, the second conductive portion 52q is between two portions of the third partial region 11c in the X-axis direction. As in the semiconductor device 141a, the side surface of the second conductive portion 52q may be oblique to the Y-axis direction. In such a configuration as well, a semiconductor device is obtained in which the characteristics can be improved. The configuration of the second conductive part 52 described with reference to the semiconductor device 141 is applicable to any semiconductor device according to the first and second embodiments.

Figure 30:
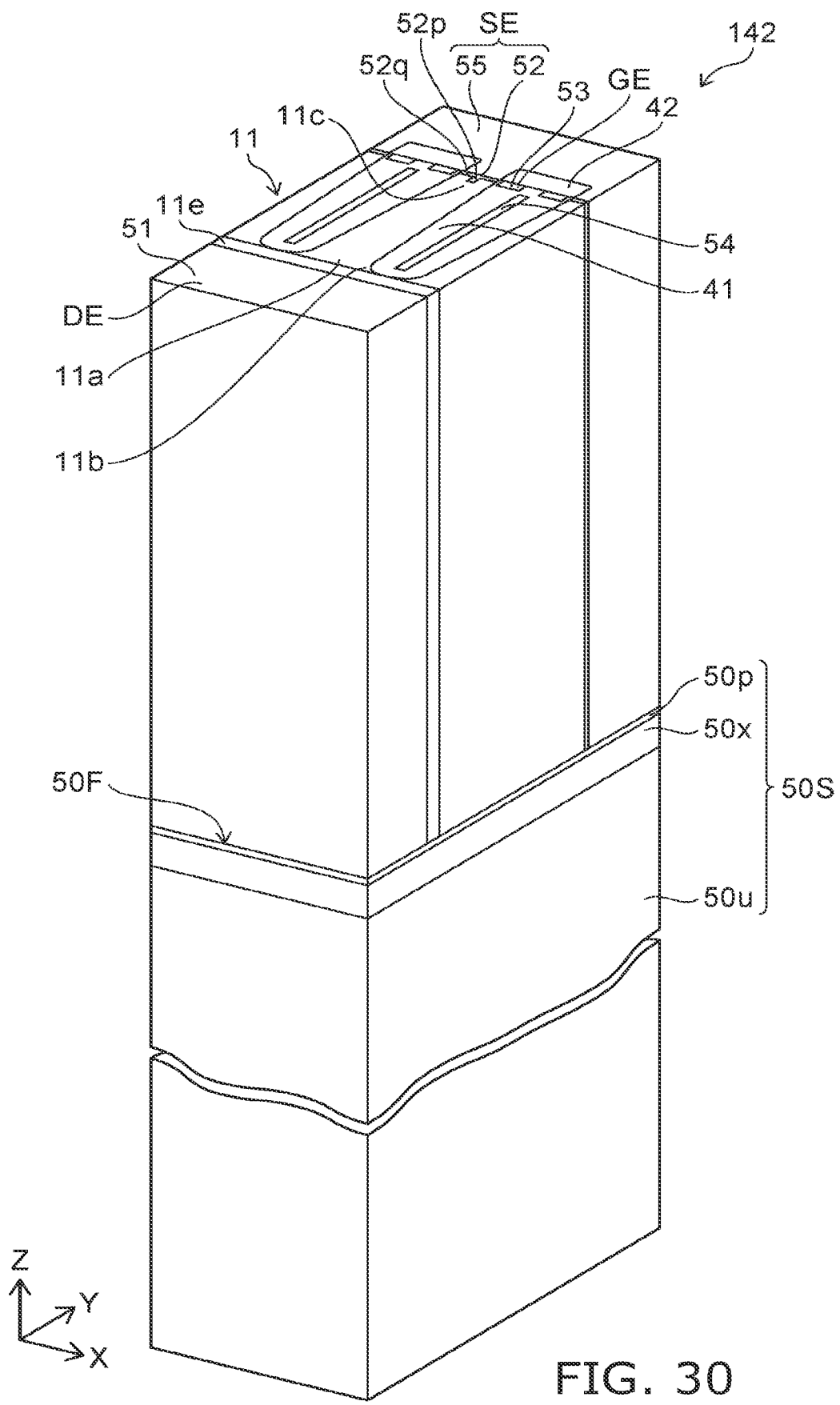
FIG. 30 is a schematic perspective view illustrating a semiconductor device according to the embodiment.

FIG. 30 is a schematic perspective view illustrating a semiconductor device according to the embodiment.

In the semiconductor device 142 according to the embodiment as shown in FIG. 30, the supporter 50S includes a base semiconductor region 50p in addition to the substrate part 50u and the insulating layer 50x. For example, the base semiconductor region 50p is of the second conductivity type (the p-type). The insulating layer 50x is between the substrate part 50u and the base semiconductor region 50p. In the example, the first surface 50F corresponds to the upper surface of the base semiconductor region 50p. For example, the base semiconductor region 50p functions as a terminal region. The first conductive part 51 may not reach the first surface 50F. The configuration of the supporter 50S described with reference to the semiconductor device 142 is applicable to any semiconductor device according to the first and second embodiments.

According to the embodiments, a semiconductor device can be provided in which the characteristics can be improved. In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive parts, semiconductor regions, insulating parts, interconnects, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a supporter including a first surface;
a first conductive part;
a second conductive part, a first direction from the first conductive part toward the second conductive part being along the first surface;
a first semiconductor region of a first conductivity type, the first semiconductor region including a first partial region, a second partial region, and a third partial region, a second direction from the first partial region toward the second partial region being along the first surface and crossing the first direction, the third partial region being between the first partial region and the second conductive part in the first direction, the third partial region including a counter surface facing the second conductive part, the third partial region and the second conductive part having a Schottky contact;
a third conductive part, a direction from the counter surface toward the third conductive part being along the second direction; and
a first insulating part including a first insulating region, at least a portion of the first insulating region being between the counter surface and the third conductive part, the first insulating region physically contacting the counter surface.

2. The device according to claim 1, wherein
a direction from a portion of the third partial region toward the third conductive part is along the second direction, and
a direction from at least a portion of the second conductive part toward the third conductive part is along the second direction.

3. The device according to claim 1, wherein
the third partial region includes a first region and a second region,
the first region is between the second region and the second conductive part in the first direction, and
a concentration of an impurity of the first conductivity type in the first region is greater than a concentration of an impurity of the first conductivity type in the second region.

4. The device according to claim 1, wherein
the second conductive part includes a first conductive region and a second conductive region,
the first conductive region is between the first partial region and the second conductive region in the first direction,
the second conductive region includes a first element,
the third partial region includes a second element, and
the first conductive region includes a compound including the first and second elements.

5. The device according to claim 1, wherein
the second conductive part includes a first conductive region and a second conductive region,
the first conductive region is between the third partial region and the second conductive region in the first direction, the second conductive region includes a first metallic element, the third partial region includes silicon, and the first conductive region includes a silicide including the first metallic element.

6. The device according to claim 1, further comprising:

a fourth conductive part, the first semiconductor region further including a fourth partial region, the second partial region being between the first partial region and the fourth partial region in the second direction, a direction from the fourth partial region toward the fourth conductive part being along the first direction, a direction from at least a portion of the third partial region toward the fourth conductive part being along the second direction, the first insulating part including a second insulating region, the second insulating region being between the fourth conductive part and the at least a portion of the third partial region in the second direction.

7. The device according to claim 6, wherein the fourth conductive part is electrically connected to the second conductive part.

8. The device according to claim 6, further comprising:

a fifth conductive part, the second conductive part being between the third partial region and at least a portion of the fifth conductive part in the first direction, the fifth conductive part being electrically connected to the second and fourth conductive parts.

9. The device according to claim 8, further comprising:

a second insulating part, the third conductive part being between the second partial region and the fifth conductive part in the first direction, at least a portion of the second insulating part being between the third conductive part and at least a portion of the fifth conductive part in the first direction.

10. The device according to claim 8, wherein the first conductive part is provided around the fifth conductive part in a plane including the first and second directions, a plurality of cells is provided between the fifth conductive part and the first conductive part, and one of the plurality of cells includes the second and third conductive parts.

11. The device according to claim 6, comprising:

a plurality of the second conductive parts; and a plurality of the fourth conductive parts, a position in the second direction of one of the plurality of second conductive parts and a position in the second direction of an other one of the plurality of second conductive parts being between a position in the second direction of one of the plurality of fourth conductive parts and a position in the second direction of an other one of the plurality of fourth conductive parts, the other one of the plurality of fourth conductive parts being next to the one of the plurality of fourth conductive parts.

12. The device according to claim 6, wherein an impurity concentration of the first conductivity type in the fourth partial region is greater than an impurity concentration of the first conductivity type in the third partial region.

13. The device according to claim 1, wherein the first semiconductor region includes a fifth partial region, the fifth partial region is provided between the first conductive part and the first partial region, and an impurity concentration of the first conductivity type in the fifth partial region is greater than an impurity concentration of the first conductivity type in the first partial region.

14. The device according to claim 1, further comprising:

a second semiconductor region of a second conductivity type, the second semiconductor region being between the second conductive part and a portion of the third partial region in the first direction, an other portion of the third partial region being between the second semiconductor region and the first insulating region in the second direction.

15. The device according to claim 1, further comprising:

a first member, the first semiconductor region further including a fourth partial region, the second partial region being between the first partial region and the fourth partial region in the second direction, a direction from the fourth partial region toward the first member being along the first direction, a direction from at least a portion of the third partial region toward the first member being along the second direction, the first insulating part including a second insulating region, the second insulating region being between the first member and the at least a portion of the third partial region in the second direction, the first member being electrically connected to the fourth partial region, the first member being electrically connected to the second conductive part or capable of being electrically connected to the second conductive part, a resistivity of the first member being greater than a resistivity of the fourth partial region and less than a resistivity of the second insulating region.

16. The device according to claim 1, further comprising:

a first member, a direction from the second partial region toward the first member being along the first direction, a direction from at least a portion of the third partial region toward the first member being along the second direction, the first insulating part including a second insulating region, the second insulating region being between the first member and the at least a portion of the third partial region in the second direction, the first member being electrically connected to a fourth partial region, the first member being electrically connected to the second conductive part or capable of being electrically connected to the second conductive part, the first member including at least one selected from the group consisting of a first material, a second material, a third material, a fourth material, a fifth material, and a sixth material, the first material including Si, N, and O, the second material including a Si-N bond, a N-O bond, and a N-N bond, the third material including a Si-N bond, a N-H bond, and a N-N bond, the fourth material including Si, C, and a first element, the first element including at least one selected from the group consisting of B and N, the fifth material including Si, O, and a second element, the second element including at least one selected from the group consisting of Fe, Au, Ni, Ta, W, and Ti, the sixth material including a third element and a fourth element, the third element including at least one selected from the group consisting of In, Al, and Ga, the fourth element including at least one selected from the group consisting of P, As, B, Fe, Au, Ni, Ta, W, and Ti.

17. The device according to claim 1, wherein a first cell group and a second cell group are provided, the first cell group and the second cell group each include the second conductive part, and a direction from the first cell group toward the second cell group is along the first direction.

18. The device according to claim 1, wherein first to fourth cell groups are provided, the first to fourth cell groups each include the first and second conductive parts, the second cell group is between the first cell group and the fourth cell group, the third cell group is between the second cell group and the fourth cell group, an orientation from the first conductive part of the first cell group toward the second conductive part of the first cell group is a reverse of an orientation from the first conductive part of the second cell group toward the second conductive part of the second cell group, an orientation from the first conductive part of the third cell group toward the second conductive part of the third cell group is a reverse of an orientation from the first conductive part of the fourth cell group toward the second conductive part of the fourth cell group, and the orientation from the first conductive part of the first cell group toward the second conductive part of the first cell group is a same orientation as the orientation from the first conductive part of the third cell group toward the second conductive part of the third cell group.

19. A semiconductor device, comprising:
a supporter including a first surface;
a first conductive part;
a second conductive part, a first direction from the first conductive part toward the second conductive part being along the first surface;
a first semiconductor region of a first conductivity type, the first semiconductor region including a first partial region, a second partial region, and a third partial region, a second direction from the first partial region toward the second partial region being along the first surface and crossing the first direction, the third partial region being between the first partial region and the second conductive part in the first direction;
a second semiconductor region provided between the third partial region and the second conductive part, the second semiconductor region being of a second conductivity type, a third conductive part, a direction from at least a portion of the second semiconductor region toward the third conductive part being along the second direction;
a first insulating part including a first insulating region, at least a portion of the first insulating region being between the third conductive part and the at least a portion of the second semiconductor region, wherein the first conductive part and the second conductive part extend along a third direction perpendicular to the first surface.

20. A semiconductor device, comprising:
a supporter including a first surface;
a first conductive part;
a second conductive part, a first direction from the first conductive part toward the second conductive part being along the first surface;
a first semiconductor region of a first conductivity type, the first semiconductor region including a first partial region, a second partial region, and a third partial region, a second direction from the first partial region toward the second partial region being along the first surface and crossing the first direction, the third partial region being between the first partial region and the second conductive part in the first direction, the third partial region including a counter surface facing the second conductive part, the third partial region and the second conductive part having a Schottky contact;
a third conductive part, a direction from the counter surface toward the third conductive part being along the second direction; and
a first insulating part including a first insulating region, at least a portion of the first insulating region being between the counter surface and the third conductive part, wherein the third partial region includes a first region and a second region, the first region is between the second region and the second conductive part in the first direction, and a concentration of an impurity of the first conductivity type in the first region is greater than a concentration of an impurity of the first conductivity type in the second region.

* * * * *